United States Patent
Mou et al.

(10) Patent No.: US 11,296,171 B2
(45) Date of Patent: Apr. 5, 2022

(54) DISPLAY SUBSTRATE AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Xin Mou, Beijing (CN); Yongfu Diao, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/256,869

(22) PCT Filed: Nov. 27, 2020

(86) PCT No.: PCT/CN2020/132144
§ 371 (c)(1),
(2) Date: Dec. 29, 2020

(87) PCT Pub. No.: WO2021/104428
PCT Pub. Date: Jun. 3, 2021

(65) Prior Publication Data
US 2021/0376026 A1 Dec. 2, 2021

(30) Foreign Application Priority Data

Nov. 29, 2019 (WO) ................ PCT/CN2019/122129

(51) Int. Cl.
*G09G 3/30* (2006.01)
*H01L 27/32* (2006.01)
(Continued)

(52) U.S. Cl.
CPC ....... *H01L 27/3262* (2013.01); *G09G 3/2003* (2013.01); *G09G 3/3233* (2013.01);
(Continued)

(58) Field of Classification Search
CPC ............. H01L 27/3262; H01L 27/1222; H01L 27/3216; H01L 27/3265; H01L 27/3276;
(Continued)

(56) References Cited

U.S. PATENT DOCUMENTS

| 7,091,936 B1 | 8/2006 | Yamada |
| 10,353,261 B2 | 7/2019 | Xing |

(Continued)

FOREIGN PATENT DOCUMENTS

| CN | 107422557 A | 12/2017 |
| CN | 107991818 A | 5/2018 |

(Continued)

*Primary Examiner* — Pegeman Karimi
(74) *Attorney, Agent, or Firm* — Scully Scott Murphy & Presser

(57) ABSTRACT

A display substrate and a display device are provided. The display substrate includes sub-pixels and a light emitting control signal line. The sub-pixel includes an organic light emitting element and a pixel circuit, the organic light emitting element includes a second electrode, the pixel circuit includes a driving transistor and a first light emitting control transistor, and the pixel circuit further includes a connection structure. In the second color sub-pixel, a first electrode of the first light emitting control transistor is electrically connected with the connection structure through a first connection hole, and the connection structure is electrically connected with the second electrode through a second connection hole, the first connection hole and the second connection hole are located on both sides of the light
(Continued)

emitting control signal line. In the third color sub-pixel, the second electrode does not overlap with a channel of the driving transistor.

22 Claims, 12 Drawing Sheets

(51) Int. Cl.
*G09G 3/3233* (2016.01)
*G09G 3/20* (2006.01)
*H01L 27/12* (2006.01)

(52) U.S. Cl.
CPC ...... H01L 27/3265 (2013.01); H01L 27/3276 (2013.01); *G09G 2300/0426* (2013.01); *G09G 2300/0443* (2013.01); *G09G 2310/061* (2013.01); *H01L 27/1222* (2013.01); *H01L 27/3216* (2013.01)

(58) Field of Classification Search
CPC ...... G09G 3/2003; G09G 3/32; G09G 3/3233; G09G 2300/0426; G09G 2300/0443; G09G 2310/061; G09G 3/30
See application file for complete search history.

(56) References Cited

U.S. PATENT DOCUMENTS

| | | | |
|---|---|---|---|
| 2006/0044245 A1* | 3/2006 | Park | G09G 3/3233 345/92 |
| 2016/0049124 A1* | 2/2016 | Tsu | G09G 3/3607 345/589 |
| 2021/0005145 A1* | 1/2021 | Lee | G09G 3/3233 |
| 2021/0066398 A1* | 3/2021 | Huang | H01L 27/322 |
| 2021/0280115 A1* | 9/2021 | Wu | G09G 3/20 |

FOREIGN PATENT DOCUMENTS

| | | |
|---|---|---|
| CN | 208173203 U | 11/2018 |
| KR | 10-0542034 B1 | 1/2006 |
| TW | 490996 B | 6/2002 |

\* cited by examiner

DISPLAY SUBSTRATE AND DISPLAY DEVICE

The present application is a national stage entry of PCT International Application No. PCT/CN2020/132144, filed on Nov. 27, 2020, which claims priority to PCT International Application No. PCT/CN2019/122129, filed on Nov. 29, 2019. The entire content of PCT International Application No. PCT/CN2020/132144 and the entire content of PCT International Application No. PCT/CN2019/122129 are incorporated herein by reference as part of the present application.

TECHNICAL FIELD

At least one embodiment of the present disclosure relates to a display substrate and a display device.

BACKGROUND

Organic light emitting diodes have advantages of self-luminescence, high efficiency, bright color, thin and light, power saving, curling, wide using temperature range, and so on, and have been gradually applied to fields such as large-area display, lighting, vehicle display, and the like.

SUMMARY

At least an embodiment of the present disclosure provides a display substrate and a display device. The display substrate comprises: a base substrate and a plurality of first color sub-pixels, a plurality of second color sub-pixels and a plurality of third color sub-pixels disposed on the base substrate; a light emitting control signal line, extending along a first direction; a data line, extending along a second direction, the first direction being intersected with the second direction; and a power line, overlapping with the data line in a third direction perpendicular to the base substrate, wherein at least one sub-pixel comprises an organic light emitting element and a pixel circuit for driving the organic light emitting element, the organic light emitting element comprises a first electrode, a second electrode and a light emitting layer disposed between the first electrode and the second electrode; the pixel circuit comprises a driving transistor and a first light emitting control transistor, and the pixel circuit further comprises a connection structure disposed in the same layer as the data line, in at least one second color sub-pixel, a first electrode of the first light emitting control transistor of the second color sub-pixel is electrically connected with the connection structure through a first connection hole, and the connection structure is electrically connected with the second electrode of the second color sub-pixel through a second connection hole, an orthographic projection of at least part of the first connection hole on the base substrate is located on a side of an orthographic projection of the light emitting control signal line on the base substrate, and an orthographic projection of at least part of the second connection hole on the base substrate is located on the other side of the orthographic projection of the light emitting control signal line on the base substrate; in at least one third color sub-pixel, the second electrode of the third color sub-pixel does not overlap with a channel of the driving transistor controlling the organic light emitting element of the third color sub-pixel in the third direction.

For example, in at least one embodiment of the disclosure, the second electrode of at least one third color sub-pixel does not overlap with the channels of the driving transistors controlling organic light emitting elements of the sub-pixels of the other colors in the third direction.

For example, in at least one embodiment of the disclosure, the display substrate comprises an active semiconductor layer including the channel and a source-drain region of each transistor of each sub-pixel, and the connection structure is electrically connected with the active semiconductor layer through the first connection hole in an inorganic layer between the connection structure and the active semiconductor layer; the connection structure is electrically connected with the second electrode through the second connection hole in at least one of an organic layer and an inorganic layer between the connection structure and the second electrode, and in the second color sub-pixel, a center of the orthographic projection of the first connection hole on the base substrate and a center of the orthographic projection of the second connection hole on the base substrate are respectively located on both sides of the orthographic projection of the light emitting control signal line on the base substrate.

For example, in at least one embodiment of the disclosure, in at least one second color sub-pixel, the orthographic projection of the first connection hole on the base substrate is farther away from an orthographic projection of the second electrode on the base substrate compared with the orthographic projection of the second connection hole on the base substrate.

For example, in at least one embodiment of the disclosure, in at least one second color sub-pixel, the second electrode of the second color sub-pixel overlaps with the channel of the driving transistor driving the organic light emitting element of the second color sub-pixel in the third direction.

For example, in at least one embodiment of the disclosure, the data line connected to the pixel circuit of at least one second color sub-pixel and the second electrode of the at least one second color sub-pixel are spaced apart from each other in the first direction.

For example, in at least one embodiment of the disclosure, the second electrode of the at least one second color sub-pixel and the data line connected to the pixel circuit of the third color sub-pixel overlap in the third direction.

For example, in at least one embodiment of the disclosure, an orthographic projection of the second electrode of at least one first color sub-pixel and an orthographic projection of the second electrode of at least one third color sub-pixel on a first straight line extending along the second direction overlap with an orthographic projection of the connection structure of at least one second color sub-pixel on the first straight line.

For example, in at least one embodiment of the disclosure, an orthographic projection of the second electrode of at least one third color sub-pixel on a second straight line extending along the first direction overlaps with an orthographic projection of the connection structure of at least one second color sub-pixel on the second straight line.

For example, in at least one embodiment of the disclosure, the second electrode of at least one sub-pixel comprises a main electrode and a connection electrode electrically connected with the first light emitting control transistor, an orthographic projection of the main electrode of at least one first color sub-pixel on the first straight line overlaps with the orthographic projection of the connection structure of the at least one second color sub-pixel on the first straight line.

For example, in at least one embodiment of the disclosure, an orthographic projection of the main electrode of the at least one third color sub-pixel on the second straight line overlaps with the orthographic projection of the connection structure of the at least one second color sub-pixel on the second straight line.

For example, in at least one embodiment of the disclosure, the display substrate further comprises: a scanning signal line and a reset control signal line, wherein, in at least one sub-pixel, the pixel circuit further comprises a data writing transistor and a reset transistor, a gate electrode of the data writing transistor is configured to be electrically connected with the scanning signal line to receive a scan signal, and a gate electrode of the reset transistor is configured to be electrically connected with the reset control signal line to receive a reset control signal.

For example, in at least one embodiment of the disclosure, in at least one sub-pixel, the pixel circuit further comprises a second light emitting control transistor, and a gate electrode of the first light emitting control transistor and a gate electrode of the second light emitting control transistor are both electrically connected with the light emitting control signal line to receive a light emitting control signal.

For example, in at least one embodiment of the disclosure, the second electrode of at least one second color sub-pixel overlaps with the scanning signal line in the third direction.

For example, in at least one embodiment of the disclosure, the second electrode of at least one second color sub-pixel overlaps with the scanning signal line electrically connected with the pixel circuit of the second color sub-pixel in the third direction.

For example, in at least one embodiment of the disclosure, both of the second electrode of at least one first color sub-pixel and the second electrode of at least one third color sub-pixel overlap with the light emitting control signal line in the third direction.

For example, in at least one embodiment of the disclosure, the second electrode of at least one first color sub-pixel comprises a first electrode sub-part and a second electrode sub-part located on both sides of the light emitting control signal line, respectively, and an area of the first electrode sub-part is larger than that of the second electrode sub-part; in at least one first color sub-pixel, a center of the orthographic projection of the second connection hole on the base substrate and an orthographic projection of the first electrode sub-part on the base substrate are located on both sides of the orthographic projection of the light emitting control signal line on the base substrate, respectively.

For example, in at least one embodiment of the disclosure, in at least one sub-pixel, the pixel circuit further comprises a storage capacitor, a second electrode of the storage capacitor is also used as a gate electrode of the driving transistor, and an area of the second electrode of the storage capacitor of at least one first color sub-pixel is different from that of the second electrode of the storage capacitor of at least one second color sub-pixel.

For example, in at least one embodiment of the disclosure, an area of the second electrode of at least one first color sub-pixel is greater than an area of the second electrode of at least one second color sub-pixel, and the area of the second electrode of the storage capacitor of at least one first color sub-pixel is greater than that of the second electrode of the storage capacitor of at least one second color sub-pixel.

For example, in at least one embodiment of the disclosure, in at least one second color sub-pixel, a first electrode of the storage capacitor overlaps with the connection structure in the third direction.

For example, in at least one embodiment of the disclosure, in at least one sub-pixel, the channel of the driving transistor of the sub-pixel comprises a plurality of channel sub-parts connected in sequence, at least part of the plurality of channel sub-parts extend along the first direction, and orthographic projections of two channel sub-parts extending along the first direction on the second straight line do not overlap.

For example, in at least one embodiment of the disclosure, the plurality of channel sub-parts comprise five channel sub-parts connected in sequence, three of the five channel sub-parts extend along the first direction, orthographic projections of two of the three channel sub-parts on the second straight line do not overlap, orthographic projections of two of the three channel sub-parts on the first straight line overlap, and orthographic projections of two channel sub-parts except the three channel sub-parts of the five channel sub-parts on the first straight line overlap.

For example, in at least one embodiment of the disclosure, the five channel sub-parts comprise a first channel sub-part, a second channel sub-part, a third channel sub-part, a fourth channel sub-part and a fifth channel sub-part, which are connected in sequence, the first channel sub-part, the third channel sub-part, and the fifth channel sub-part extend along the first direction, the first channel sub-part and the third channel sub-part are parallel to each other, and the first channel sub-part and the fifth channel sub-part are crossed by a third straight line extending along the first direction and orthographic projections of the first channel sub-part and the fifth channel sub-part on the second straight line do not overlap, and the second channel sub-part and the fourth channel sub-part extend along the second direction and are parallel to each other.

For example, in at least one embodiment of the disclosure, the display substrate further comprises: a pixel defining layer located at a side of the second electrode of each sub-pixel away from the base substrate, wherein the pixel defining layer comprises an opening for defining a light emitting region of each sub-pixel, at least part of the organic light emitting layer of each sub-pixel is located in the opening, and an orthographic projection of the opening of the pixel defining layer on the base substrate is located in an orthographic projection of the main electrode of the second electrode of each sub-pixel on the base substrate; in the pixel defining layer, an area of an opening defining a light emitting region of each third color sub-pixel is greater than an area of an opening defining a light emitting region of each second color sub-pixel and smaller than an area of an opening defining a light emitting region of each first color sub-pixel.

For example, in at least one embodiment of the disclosure, the second electrode of at least one first color sub-pixel overlaps with the data line in the third direction, and a length of an overlapped portion of the second electrode and the data line in the second direction is greater than 80% of a maximum length of the second electrode in the second direction.

For example, in at least one embodiment of the disclosure, the second electrode of at least one first color sub-pixel overlaps with the power line in the third direction, and a length of an overlapped portion of the second electrode and the power line in the second direction is greater than 80% of a maximum length of the second electrode in the second direction.

For example, in at least one embodiment of the disclosure, in at least one second color sub-pixel, the orthographic projection of the first connection hole on the base substrate has a first area, the orthographic projection of the second connection hole on the base substrate has a second area, and the first area is different from the second area.

For example, in at least one embodiment of the disclosure, in at least one second color sub-pixel, the first connection hole has a first distance from the light emitting control signal line in the second direction, the second connection hole has a second distance from the light emitting control signal line in the second direction, and the first distance is different from the second distance.

Another embodiment of the disclosure provides a display device, comprising the display substrate as mentioned above.

BRIEF DESCRIPTION OF THE DRAWINGS

In order to clearly illustrate the technical solution of the embodiments of the present disclosure, the drawings of the embodiments will be briefly described in the following. It is obvious that the described drawings in the following are only related to some embodiments of the present disclosure and thus are not limitative of the present disclosure.

FIG. 9A-FIG. 10A are schematic diagrams of layers of a pixel circuit provided by some embodiments of the present disclosure;

DETAILED DESCRIPTION

Figure 1A:
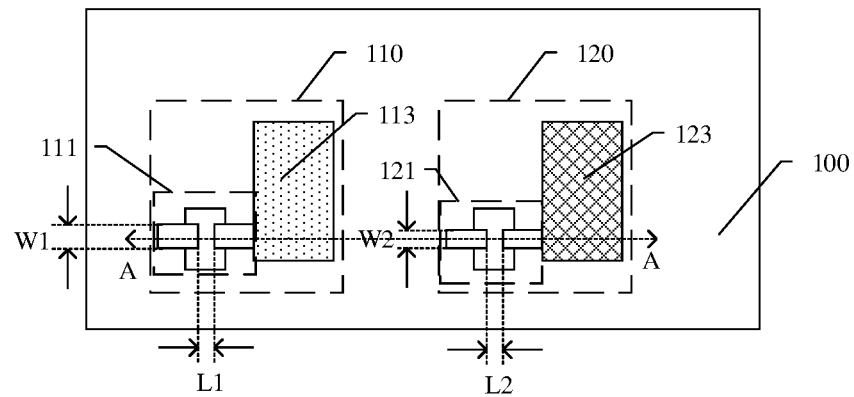
FIG. 1A is a planar diagram of an array substrate provided by an embodiment of the present disclosure.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present disclosure, are not intended to indicate any sequence, amount or importance, but distinguish various components. Also, the terms "comprise," "comprising," "comprise," "comprising," etc., are intended to specify that the elements or the objects stated before these terms encompass the elements or the objects and equivalents thereof listed after these terms, but do not preclude the other elements or objects.

At least one embodiment of the present disclosure relates to a display substrate and a display device. The display substrate comprises: a base substrate and a plurality of first color sub-pixels, a plurality of second color sub-pixels and a plurality of third color sub-pixels disposed on the base substrate; a light emitting control signal line extending along a first direction; a data line extending along a second direction, the first direction being intersected with the second direction; and a power line overlapping with the data line in a third direction perpendicular to the base substrate. At least one sub-pixel comprises an organic light emitting element and a pixel circuit for driving the organic light emitting element, the organic light emitting element comprises a first electrode, a second electrode and a light emitting layer disposed between the first electrode and the second electrode; the pixel circuit comprises a driving transistor and a first light emitting control transistor, and the pixel circuit further comprises a connection structure disposed in the same layer as the data line. In at least one second color sub-pixel, a first electrode of the first light emitting control transistor of the second color sub-pixel is electrically connected with the connection structure through a first connection hole, and the connection structure is electrically connected with the second electrode of the second color sub-pixel through a second connection hole, an orthographic projection of at least part of the first connection hole on the base substrate is located on a side of an orthographic projection of the light emitting control signal line on the base substrate, and an orthographic projection of at least part of the second connection hole on the base substrate is located on the other side of the orthographic projection of the light emitting control signal line on the base substrate. In at least one third color sub-pixel, the second electrode of the third color sub-pixel does not overlap with a channel of the driving transistor controlling the organic light emitting element of the third color sub-pixel in the third direction. The present disclosure provides a pixel arrangement structure, which can effectively drive the second color sub-pixel to emit light by the connection structure on the basis of improving the compactness of the pixel arrangement to improve the pixel resolution by setting a positional relationship between the two connection holes and the light emitting control signal line and a positional relationship between the second electrode of the third color sub-pixel and the channel of the driving transistor of the third color sub-pixel. In the present disclosure, data lines and power lines are disposed in different layers, namely double-layer signal lines, so as to realize the tight arrangement of pixels and the optimized wiring mode.

The display substrate and the display device provided by the embodiments of the present disclosure will be described below with reference to the drawings.

Figure 1B:
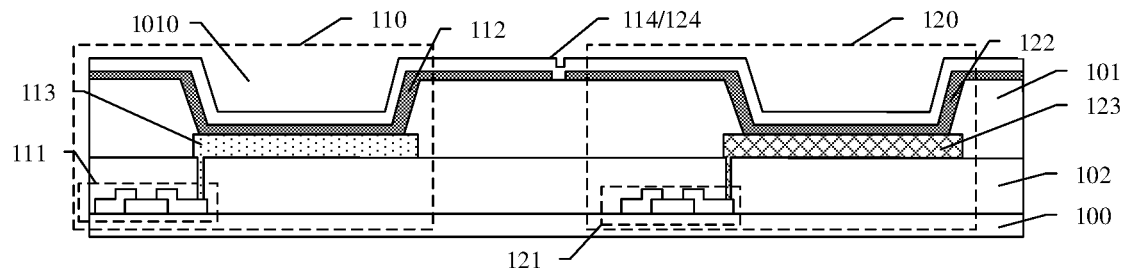
FIG. 1B is a partial cross-sectional diagram of the array substrate shown in FIG. 1A.

FIG. 1A is a planar diagram of an array substrate provided by an embodiment of the present disclosure; and FIG. 1B is a partial cross-sectional diagram of the array substrate shown in FIG. 1A along a line AA. As shown in FIG. 1A, an embodiment of the present disclosure provides an array substrate, which comprises a base substrate 100 and a first color sub-pixel 110 and a second color sub-pixel 120 on the base substrate 100. The first color sub-pixel 110 comprises a first driving transistor 111, the second color sub-pixel 120 comprises a second driving transistor 121, and a channel width-length ratio W1/L1 of the first driving transistor 111 is greater than a channel width-length ratio W2/L2 of the second driving transistor 121. That is, a channel width of the first driving transistor 111 is W1 and a channel length of the first driving transistor 111 is L1, a channel width of the second driving transistor 121 is W2 and a channel length of the second driving transistor 121 is L2, and W1, L1, W2 and L2 satisfies a relationship of W1/L1>W2/L2. FIG. 1A schematically shows that the first driving transistor and the second driving transistor have the same channel length, but have different channel widths. The embodiments of the present disclosure are not limited thereto, and the channel widths of the first driving transistor and the second driving transistor may be the same, but the channel lengths are different, or the channel widths and channel lengths of the first driving transistor and the second driving transistor are all different.

The embodiments of the present disclosure can improve the brightness of the display device comprising the array substrate by optimizing the channel width-length ratios of the driving transistors of the sub-pixels with different colors on the array substrate.

In some examples, current efficiency of the first color sub-pixel is less than current efficiency of the second color sub-pixel. The current efficiency here refers to the light emitting intensity of sub-pixel of each color at a unit current (unit: candela per ampere, cd/A). Because the current efficiency of sub-pixels with different colors are different, by setting the channel width-length ratios of the driving transistors of sub-pixels with different colors to be different, in a case where white light displayed by the display device comprising the array substrate is at the highest gray scale, a phenomenon of insufficient brightness of the first color is avoided.

In some examples, the first color sub-pixel 110 is a blue sub-pixel, and the second color sub-pixel 120 is a red sub-pixel or a green sub-pixel. In the embodiments of the present disclosure, by setting the channel width-length ratio of the driving transistor of the blue sub-pixel to be greater than the channel width-length ratio of the driving transistor of the red sub-pixel or the green sub-pixel, in a case where white light displayed by the display device comprising the array substrate is at the highest gray scale, a phenomenon of insufficient brightness of blue light is avoided, so that the white balance color coordinate of the white light at the highest gray level can be avoided from deviating from the design value.

The above-mentioned white balance refers to the balance of the white light, that is, an indicator of the accuracy of the white light formed by mixing the three primary colors of red, green, and blue displayed by the display device.

For example, the first color sub-pixel 110 may also be a blue sub-pixel, and the second color sub-pixel 120 may also be a yellow sub-pixel.

Figure 1C:
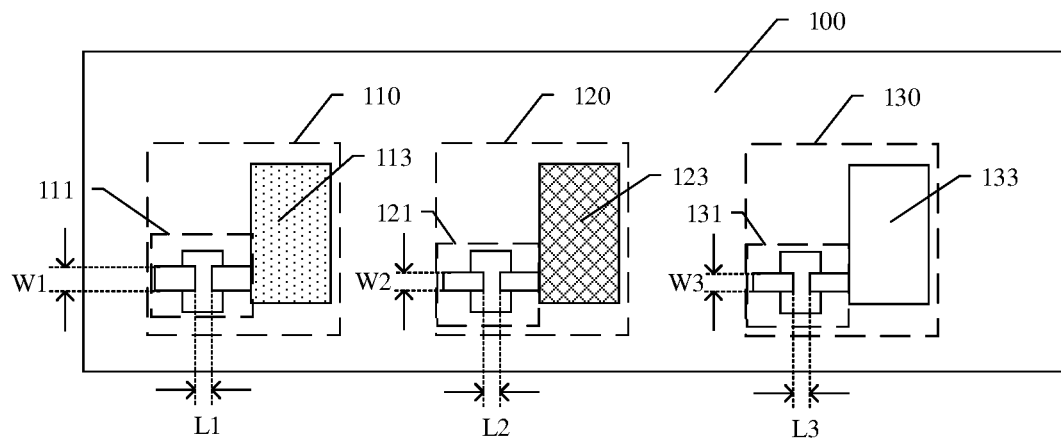
FIG. 1C is a planar diagram of an array substrate provided by an embodiment of the present disclosure.

FIG. 1C is a planar diagram of an array substrate provided by an embodiment of the present disclosure. As shown in FIG. 1C, the array substrate may further comprise a third color sub-pixel 130, and the third color sub-pixel 130 comprises a third driving transistor 131.

For example, the first color sub-pixel 110 is a blue sub-pixel, the second color sub-pixel 120 is a red sub-pixel, and the third color sub-pixel 130 is a green sub-pixel.

For example, the channel width-length ratio of the second driving transistor 121 of the red sub-pixel may be the same as the channel width-length ratio of the third driving transistor 131 of the green sub-pixel, so as to facilitate manufacturing. However, the embodiments are not limited to this case, and the channel width-length ratios of the driving transistors of the red sub-pixel and the green sub-pixel may be adjusted according to the brightness requirements of each color light in a case where the display device realizes high-brightness display.

In some examples, a ratio of the channel width-length ratio of the driving transistor of the red sub-pixel, the channel width-length ratio of the driving transistor of the green sub-pixel, and the channel width-length ratio of the driving transistor of the blue sub-pixel is about 1:(0.7~1.3):(1.5~2.5), so that in a case where the brightness of white light displayed by the display device is 800 nits or even 1000 nits, the phenomenon of insufficient brightness of blue light will not occur.

In some examples, the ratio of the channel width-length ratio of the driving transistor of the red sub-pixel, the channel width-length ratio of the driving transistor of the green sub-pixel, and the channel width-length ratio of the driving transistor of the blue sub-pixel may be 1:1:2, so as to facilitate actual manufacturing process.

Figure 1D:
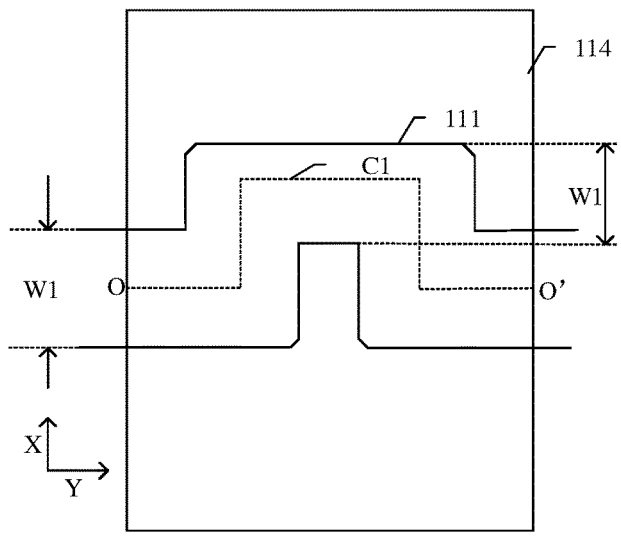
FIG. 1D and FIG. 1E are planar diagrams of driving transistors of a first color sub-pixel and a second color sub-pixel, respectively.
Figure 1E:
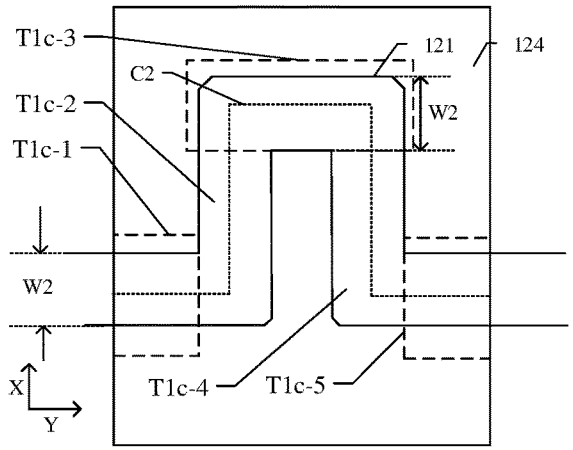

In some examples, FIG. 1D and FIG. 1E are planar diagrams of driving transistors of a first color sub-pixel and a second color sub-pixel, respectively. As shown in FIG. 1D and FIG. 1E, a portion of an active layer of the first driving transistor 111 of the first color sub-pixel 110 that overlaps with a gate electrode 114 is the channel of the first driving transistor 111, and the channel width-length ratio W1/L1 of the first driving transistor 111 may be 5/25. A portion of an active layer of the second driving transistor 121 of the second color sub-pixel 120 that overlaps with a gate electrode 124 is the channel of the second driving transistor 121, and the channel width-length ratio W2/L2 of the second driving transistor 121 may be 3/30. For example, as shown in FIG. 1D, center points of portions of the active layer of the first driving transistor 111 overlapping with edges of the gate electrode 114 extending in the X direction are O and O', respectively, and a center line C1 of the portion of the active layer of the first driving transistor 111 overlapping with the gate electrode 114 extends from O to O'. The "length" in the above channel width-length ratio refers to the length L1 of the center line C1, and the "width" in the channel width-length ratio refers to a size of the portions of the active layer of the first driving transistor 111 overlapping with edges of the gate electrode 114 extending in the X direction. Similarly, as shown in FIG. 1E, the "length" in the channel width-length ratio of the second driving transistor 121 refers to the length L2 of the center line C2, and the "width" in the channel width-length ratio refers to a size of portions of the active layer of the second driving transistor 121 overlapping with edges of the gate electrode 124 extending in the X direction.

For example, as shown in FIG. 1E, in at least one pixel unit, the channel of the driving transistor T1 in each sub-pixel includes a plurality of channel sub-parts connected in sequence, at least part of the plurality of channel sub-parts extend along the first direction, and orthographic projections of two channel sub-parts extending along the first direction on a second straight line extending in the first direction do not overlap.

For example, as shown in FIG. 1E, the plurality of channel sub-parts includes five channel sub-parts T1c-1, T1c-2, T1c-3, T1c-4 and T1c-5 connected in sequence, three channel sub-parts T1c-1, T1c-3 and T1c-5 extend along the first direction, orthographic projections of two channel sub-parts T1c-2 and T1c-4 on a first straight line extending in the second direction overlap, orthographic projections of two channel sub-parts T1c-1 and T1c-5 of the three channel sub-parts T1c-1, T1c-3 and T1c-5 on the second straight line do not overlap, and orthographic projections of two channel sub-parts T1c-1 and T1c-5 of the three channel sub-parts T1c-1, T1c-3 and T1c-5 on the first straight line overlap.

For example, as shown in FIG. 1E, the five channel sub-parts T1c-1, T1c-2, T1c-3, T1c-4 and T1c-5 include a first channel sub-part T1c-1, a second channel sub-part T1c-2, a third channel sub-part T1c-3, a fourth channel sub-part T1c-4 and a fifth channel sub-part T1c-5, which are connected in sequence. The first channel sub-part T1c-1, the third channel sub-part T1c-3, and the fifth channel sub-part T1c-5 extend along the first direction, the first channel sub-part T1c-1 and the third channel sub-part T1c-3 are parallel to each other. The first channel sub-part T1c-1 and the fifth channel sub-part T1c-5 are crossed by a third straight line extending along the first direction and orthographic projections of the first channel sub-part T1c-1 and the fifth channel sub-part T1c-5 on the second straight line do not overlap, and the second channel sub-part T1c-2 and the fourth channel sub-part T1c-4 are parallel to each other.

For example, as shown in FIG. 1D, upon the width of the channel being large, the channel of the driving transistor T1 includes three channel sub-parts connected in sequence, which all extend along the first direction and form a channel shape similar to an "n" shape.

For example, as shown in FIG. 1D and FIG. 1E, the channel width-length ratio of the driving transistor of the blue sub-pixel may be 5/25, and the channel width-length ratio of the green sub-pixel and the channel width-length ratio of the red sub-pixel may be 3/30.

The embodiments of the present disclosure do not limit the specific channel width-length ratio of the driving transistor of sub-pixel of each color, as long as the ratio of the channel width-length ratios of the driving transistors of sub-pixels of respective colors satisfies the above ratio range.

In some examples, sub-pixel of each color in the array substrate comprises an organic light emitting element, the organic light emitting element comprises a light emitting layer, and a first electrode and a second electrode on two sides of the organic light emitting layer, one of the first electrode and the second electrode is connected to the driving transistor, that is, the array substrate in the embodiments of the present disclosure is an array substrate applied in an organic light emitting diode display device.

For example, as shown in FIG. 1A and FIG. 1B, the first color sub-pixel 110 comprises a first organic light emitting layer 112, a first electrode 114 on a side of the first organic light emitting layer 112 away from the base substrate 100, and a second electrode 113 on a side of the first organic light emitting layer 112 facing the base substrate 100, and the second electrode 113 is connected to one of a source electrode and a drain electrode of the first driving transistor 111. The second color sub-pixel 120 comprises a second organic light emitting layer 122, a first electrode 124 on a side of the second organic light emitting layer 122 away from the base substrate 100, and a second electrode 123 on a side of the second organic light emitting layer 122 facing the base substrate 100, and the second electrode 123 is connected to one of a source electrode and a drain electrode of the second driving transistor 121. The first electrodes of the sub-pixels with different colors shown in FIG. 1B may be a common electrode, and the first electrodes of the sub-pixels with different colors may be formed of the same layer and the same material to reduce the process.

For example, as shown in FIG. 1C, the second electrode 133 of the organic light emitting element in the third color sub-pixel 130 is connected to one of a source electrode and a drain electrode of the third driving transistor 131.

For example, as shown in FIG. 1B, the array substrate further comprises a pixel defining layer 101 between adjacent organic light emitting layers and a planarization layer 102 between the second electrode and the driving transistor.

For example, the first electrode of sub-pixel of each color may be a cathode, and the cathode is also used as a connection electrode for transmitting a negative voltage of sub-pixel of each color, and has better conductivity and a lower work function value. The embodiment comprises but is not limited thereto. The second electrode of sub-pixel of each color may be an anode. The anode is also used as a connection electrode for transmitting a positive voltage of sub-pixel of each color, and has better conductivity and a higher work function value. The embodiment comprises but is not limited thereto.

For example, the driving transistor of sub-pixel of each color in the embodiments of the present disclosure may be a low-temperature polysilicon (LTPS) thin film transistor. For a sub-pixel comprising the low-temperature polysilicon thin film transistor, the saturation current I flowing through the organic light emitting element satisfies the following relationship:

$$I=K1*(W/L)*(Vgs-Vth)^2, \quad (1)$$

In the above relationship (1), W and L are the channel width and the channel length of the driving transistor, respectively, K1 is related to the channel mobility of the driving transistor and the channel capacitance per unit area, and Vgs and Vth are a voltage between the gate electrode and the source electrode and a threshold voltage of the driving transistor, respectively, and K1 is a coefficient determined by characteristics of the channel of each driving transistor, such as the channel mobility.

The above saturation current I, and the brightness Y and the current efficiency E of the sub-pixel satisfy the following relationship:

$$I=(Y*S)/E, \quad (2)$$

From the above relationship (1) and relationship (2), the following relationship is obtained:

$$I=(Y*S)/E=K1*(W/L)*(Vgs-Vth)^2, \quad (3)$$

According to the relationship (3), it can be obtained that the channel width-length ratio of the driving transistor of sub-pixel of each color satisfies the following relationship:

$$W/L=K2*(Y/E), \quad (4)$$

K2 is a coefficient related to K1, $(Vgs-Vth)^2$ and S. Therefore, the channel width-length ratio of the first driving transistor of the first color sub-pixel, the channel width-length ratio of the second driving transistor of the second color sub-pixel, and the channel width-length ratio of the third driving transistor of the third color sub-pixel all satisfy the above relationship (4).

In the above relationships (2-4), S is the area of the effective display region comprised in the array substrate. In the display device comprising the array substrate provided by the embodiments of the present disclosure, S is the area of the effective display region of the display screen of the display device. In the embodiments of the present disclosure, the above Y is the brightness of sub-pixel of each color in a case where white light formed by mixing light of sub-pixels of respective colors is in white balance.

For example, in the embodiments of the present disclosure, the case that Y is the maximum brightness for display of sub-pixel of each color after passing through the display screen where white light formed by mixing light of sub-pixels of respective colors is at the highest gray level is described as an example. For example, Y may be the display brightness of the light emitted by the organic light emitting element after passing through the display screen. For example, because the display side of the display device comprising the above array substrate usually has a circular polarizer, a touch screen, etc., the overall transmittance T of the display screen for white light is generally about 0.4, and the overall transmittances of light with different colors are slightly different. For facilitating calculation, in this embodiment, the overall transmittance of the screen for white light, red light, green light, and blue light are all 0.42, and the embodiment comprises but is not limited to this case.

For example, according to the above relationship (4), the channel width-length ratios of the driving transistors in the red sub-pixel, the green sub-pixel, and the blue sub-pixel comprised in the array substrate satisfies the following ratio relationship (5):

$$(W/L)_R:(W/L)_G:(W/L)_a = [K2_R*(Y_{[R]}/E_R)]:[K_2G*Y_{[G]}/E_G]:[K_2B*(Y_{[B]}/E_B)].$$

For example, assuming that the uniformity difference caused in the process is not considered, the channel mobility and the channel capacitance per unit area of the driving transistor in sub-pixel of each color have the same value.

Assuming that Vth compensation is considered, for example, for the driving transistor, the voltage difference between the gate electrode and the source electrode Vgs=Vdata+Vth−Vdd, the driving transistor is in a saturated state, and charges the organic light emitting element, the output saturation current I satisfies:

$$I = K1*(W/L)*(Vgs - Vth)^2 \quad (6)$$
$$= K1*(W/L)*(Vdata + Vth - Vdd - Vth)^2$$
$$= K1*(W/L)*(Vdata - Vdd)^2$$

The above Vdata is a data signal input to a sub-pixel comprising a driving transistor, and Vdd is a power supply voltage input to the driving transistor. For each sub-pixel, in a case where the power supply voltage Vdd is unchanged, the magnitude of the driving current I is directly related to the data signal Vdata (that is, the display data voltage). In a case where the data signal Vdata is equal to the power supply voltage Vdd, the output current I of the driving transistor is zero, that is, no current flows through the organic light emitting element. In this case, the sub-pixel comprising the organic light emitting element does not emit light, that is, displays black. In a case where the data signal Vdata is not equal to the power supply voltage Vdd, the output current I of the driving transistor is not zero, that is, there is a current flowing through the organic light emitting element. In this case, the sub-pixel comprising the organic light emitting element emits light, and the greater the difference between the data signal Vdata and the power supply voltage Vdd is, the greater the output current I is, the higher the gray scale displayed by the corresponding sub-pixel is, and the greater the brightness of the sub-pixel is.

Considering the uniformity difference caused by the actual process, after calculating the ratio of the channel width-length ratios of the driving transistors of sub-pixels of respective colors through the relationship (5) and the relationship (6), the ratio may be adjusted in a range to meet the process. For example, in a case where the ratio of the channel width-length ratios of the driving transistors of sub-pixels of respective colors is calculated by the above ratio relationship to be 1:0.97:2.03, it can be considered to adjust the above ratio to 1:1:2 for the convenience of design and manufacturing process.

Figure 2:
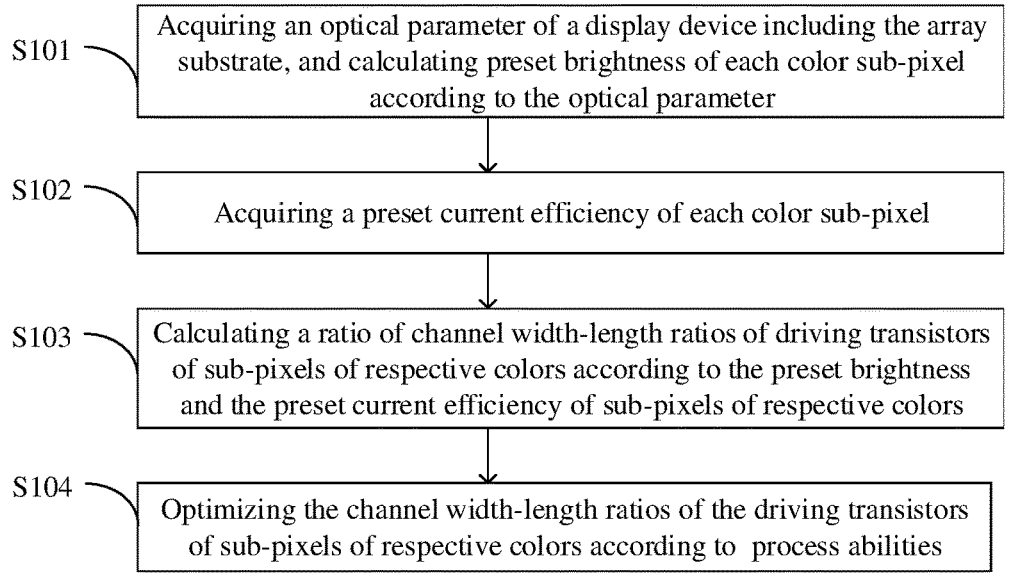
FIG. 2 is a schematic flow diagram of a manufacturing method for an array substrate provided by an embodiment of the present disclosure.

FIG. 2 is a schematic flow diagram of a manufacturing method for an array substrate provided by an embodiment of the present disclosure. As shown in FIG. 2, the method for manufacturing the driving transistor of sub-pixel of each color provided by embodiments of the present disclosure comprises the following steps.

S101: acquiring an optical parameter of a display device comprising the array substrate, and calculating preset brightness of sub-pixel of each color according to the optical parameter.

In some examples, the array substrate may comprise sub-pixels of three colors, namely a blue sub-pixel (the first color sub-pixel), a red sub-pixel (the second color sub-pixel), and a green sub-pixel (the third color sub-pixel). The object color tristimulus values of blue light emitted by the blue sub-pixel is ($X_{[B]}$, $Y_{[B]}$, $Z_{[B]}$), and the object color tristimulus values of green light emitted by the green sub-pixel is ($X_{[G]}$, $Y_{[G]}$, $Z_{[G]}$), the object color tristimulus values of red light emitted by the red sub-pixel ($X_{[R]}$, $Y_{[R]}$, $Z_{[R]}$), and the object color tristimulus values of white light formed by mixing the blue light, the green light and the red light is ($X_{[W]}$, $Y_{[W]}$, $Z_{[W]}$). The object color tristimulus values refer to the number of red, green, and blue primary colors needed to match the reflected light of the object (the three primary colors here are not physical real colors, but fictional imaginary colors), and also refer to the colorimetric values of the object color. Object color refers to the color of the object seen by eyes, that is, the color of light reflected or transmitted by the object.

For example, the object color tristimulus values X, Y and Z of sub-pixel of each color above satisfy the following relationship:

$$X = \int_{380}^{780} \bar{x}(\lambda)\Phi(\lambda)d\lambda, Y_M = \int_{380}^{780} \bar{y}(\lambda)\Phi(\lambda)d\lambda, Z = \int_{380}^{780} \bar{z}(\lambda)\Phi(\lambda)d\lambda \quad (7)$$

In the above relationship (7), $\Phi(\lambda)$ represents a function of the emission spectrum of light with a wavelength of λ and the wavelength. The above $\bar{x}(\lambda)$, $\bar{y}(\lambda)$, and $\bar{z}(\lambda)$ represent the spectral tristimulus values, which are also known as the CIE1931 standard colorimetric observer spectral tristimulus values. It should be noted that Y in the tristimulus values of each color light may represent the maximum brightness that can be achieved by the brightness of the color light to be matched in a case where the white light formed by mixing in the display device is in the white balance state. Therefore, $Y_{[B]}$, $Y_{[G]}$, $Y_{[R]}$, and $Y_{[W]}$ can be the maximum brightness of blue light, green light, red light, and white light in a case where the white light is in the white balance state, and the maximum brightness are also the preset brightness of each color light in the embodiments of the present disclosure.

For example, the color coordinate center values of each color light is (x, y, z), and the color coordinate center values of each color light and the object color tristimulus values satisfy the following relationship:

$$x=X/(X+Y+Z),$$

$$y=Y/(X+Y+Z),$$

$$z=Z/(X+Y+Z), \quad (8)$$

It can be obtained from the above relationship (8)

$$\text{that } x+y+z=1. \quad (9)$$

According to the relationship of the above color coordinates and the colorimetric value of the object color, after obtaining the preset color coordinate of sub-pixel of each color, the ratio relationship of the three parameters in the colorimetric value of the object color can be obtained.

For example, according to the additive color mixing theory, the colorimetric value of the object color of white light formed by mixing red light, green light, and blue light, and the colorimetric values of the object color of the red light, green light, and blue light satisfy the following relationship:

$$X_{[W]}=X_{[B]}+X_{[G]}+X_{[R]},$$

$$Y_{[W]}=Y_{[B]}+Y_{[G]}+Y_{[R]},$$

$$Z_{[W]}=Z_{[B]}+Z_{[G]}+Z_{[R]}. \quad (10)$$

The above relationship is written in matrix form as:

$$\begin{bmatrix} X_{[W]} \\ Y_{[W]} \\ Z_{[W]} \end{bmatrix} = \begin{bmatrix} \frac{X_{[R]}}{Y_{[R]}} & \frac{X_{[G]}}{Y_{[G]}} & \frac{X_{[B]}}{Y_{[B]}} \\ 1 & 1 & 1 \\ \frac{Z_{[R]}}{Y_{[R]}} & \frac{Z_{[G]}}{Y_{[G]}} & \frac{Z_{[B]}}{Y_{[B]}} \end{bmatrix} * \begin{bmatrix} Y_{[R]} \\ Y_{[G]} \\ Y_{[B]} \end{bmatrix}, \quad (11)$$

The maximum brightness $Y_{[R]}$, $Y_{[G]}$, and $Y_{[B]}$ of the above red light, green light, and blue light can be obtained by the inverse matrix:

$$\begin{bmatrix} X_{[R]} \\ Y_{[G]} \\ Z_{[B]} \end{bmatrix} = \begin{bmatrix} \frac{X_{[R]}}{Y_{[R]}} & \frac{X_{[G]}}{Y_{[G]}} & \frac{X_{[B]}}{Y_{[B]}} \\ 1 & 1 & 1 \\ \frac{Z_{[R]}}{Y_{[R]}} & \frac{Z_{[G]}}{Y_{[G]}} & \frac{Z_{[B]}}{Y_{[B]}} \end{bmatrix} * \begin{bmatrix} Y_{[W]} \\ Y_{[W]} \\ Y_{[W]} \end{bmatrix}, \quad (12)$$

Therefore, proportions of red light, green light, and blue light in white light are: $Y_{[R]}/Y_{[W]}$, $Y_{[G]}/Y_{[W]}$, $Y_{[B]}/Y_{[W]}$, respectively.

In some examples, when designing the ratio of the channel width-length ratios of the driving transistors of sub-pixels with different colors, the optical parameter after the array substrate is applied to an organic light emitting diode display device needs to be considered.

In some examples, the optical parameter may comprise a target brightness (the preset brightness, for example, the maximum brightness after passing through the display screen) of the white light emitted by the organic light emitting diode display device, a target white balance coordinate (the preset white balance coordinate) of the white light, and a target color coordinate center value (the preset color coordinate) of sub-pixel of each color, such as the preset color coordinates of the first color sub-pixel, the second color sub-pixel, and the third color sub-pixel.

For example, a step of calculating the preset brightness of sub-pixel of each color according to the optical parameter comprises: obtaining the colorimetric value ($X_{[W]}$, $Y_{[W]}$, $Z_{[W]}$) of the object color of white light according to the preset white balance coordinate of white light and the preset brightness of white light; and calculating the preset brightness of sub-pixel of each color according to the matrix relationship (12) and the preset color coordinate of sub-pixel of each color.

For example, in the first example of the embodiments of the present disclosure, the preset brightness of white light may be set to 800 nits, and the preset white balance coordinate of white light may be (0.30, 0.32). Because Y in the colorimetric value of the object color of white light is 800, the colorimetric value of the object color of white light is (750, 800, 950) according to the relationships (8-9).

For example, the central value of the preset color coordinate of the red sub-pixel may be (0.685, 0.315), the central value of the preset color coordinate of the green sub-pixel may be (0.252, 0.718), the central value of the preset color coordinate of the blue sub-pixel may be (0.135, 0.05). The embodiments of the present disclosure are not limited thereto, and the values can be selected according to specific requirements.

According to the above relationships (8-10) and the relationship (12), the following relationship is obtained:

$$\begin{bmatrix} Y_{M[R]} \\ Y_{M[G]} \\ Y_{M[B]} \end{bmatrix} = \begin{bmatrix} \frac{0.685}{0.315} & \frac{0.252}{0.718} & \frac{0.135}{0.05} \\ 1 & 1 & 1 \\ \frac{1-0.685-0.315}{0.315} & \frac{1-252-0.718}{0.718} & \frac{1-0.135}{0.05} \end{bmatrix} * \begin{bmatrix} 750 \\ 800 \\ 950 \end{bmatrix} = \begin{bmatrix} 184.1 \\ 559.1 \\ 56.8 \end{bmatrix}$$

According to the above calculation process, the preset brightness of sub-pixel of each color (that is, the maximum brightness after passing through the display screen) can be calculated, the preset brightness of the red sub-pixel is 184.1 nits, the preset brightness of the green sub-pixel is 559.1 nits, and the preset brightness of the blue sub-pixel is 56.8 nits. The preset brightness of white light in the above calculation is 800 nits, which is the maximum brightness considering the overall transmittance of the display screen of the display device comprising the array substrate. Therefore, the preset brightness of sub-pixel of each color is also the maximum brightness considering the overall transmittance of the display screen.

For example, in the second example of the embodiments of the present disclosure, the preset brightness of white light can be set to 800 nits, and the preset white balance coordinate of white light can be (0.307, 0.321), then the colorimetric value of the object color of white light is (765.1, 800, 927.1).

For example, the central value of the preset color coordinate of the red sub-pixel can be (0.697, 0.303), the central value of the preset color coordinate of the green sub-pixel can be (0.290, 0.68), and the central value of the preset color coordinate of the blue sub-pixel can be (0.132, 0.062). According to the above relationships (8-10) and the relationship (12), the preset brightness of the red sub-pixel is 163.2 nits, the preset brightness of the green sub-pixel is 567.4 nits, and the preset brightness of the blue sub-pixel is 69.4 nits.

For example, in the third example of the embodiments of the present disclosure, the preset brightness of white light can be set to 1000 nits, and the preset white balance coordinate of white light can be (0.307, 0.321), and the colorimetric value of the object color of white light is (956.4, 1000, 1158.9).

For example, the central value of the preset color coordinate of the red sub-pixel can be (0.698, 0.302), the central value of the preset color coordinate of the green sub-pixel can be (0.298, 0.662), and the central value of the preset color coordinate of the blue sub-pixel can be (0.137, 0.062). According to the above relationships (8-10) and the relationship (12), the preset brightness of the red sub-pixel is 190.4 nits, the preset brightness of the green sub-pixel is 723.3 nits, and the preset brightness of the blue sub-pixel is 86.3 nits.

S102: Acquiring a preset current efficiency of sub-pixel of each color.

For example, the current efficiency of sub-pixel of each color can be directly measured by an optical testing equipment and an electrical testing equipment. The optical testing device may be, for example, a spectrophotometer PR788, and an electrical testing device may be, for example, a digital source meter Keithley 2400. In the process of designing the channel width-length ratios of the driving transistors of sub-pixels with different colors, the required preset current efficiency can be obtained according to the measured current efficiency of sub-pixel of each color in a general display device. According to different materials of the organic light emitting elements of sub-pixels with different colors, the preset current efficiency of respective organic light emitting elements are also different.

For example, in the first example, the current efficiency of the red sub-pixel, the green sub-pixel, and the blue sub-pixel are 48 cd/A, 118 cd/A, and 7.2 cd/A, respectively.

For example, taking the area of the effective display region of the display device comprising the array substrate in the embodiments of the present disclosure being 0.031981 square meters as an example, the currents required by the red sub-pixel, the green sub-pixel, and the blue sub-pixel can be obtained according to the above relationship (3), and the currents of the red sub-pixel, the green sub-pixel, and the blue sub-pixel are 292 mA, 361 mA and 601 mA, respectively. It should be noted that the brightness used in calculating the current is the brightness considering the overall transmittance of the screen. In the embodiments of the present disclosure, the overall transmittance of the display screen is 42%, and the brightness of the red sub-pixel used to calculate the current is 438.3 nits, the brightness of the green sub-pixel used to calculate the current is 1331.2 nits, and the brightness of the blue sub-pixel used to calculate the current is 135.2 nits.

According to the above parameters, assuming that the driving transistors of sub-pixels of respective colors adopt the same channel width-length ratio, the current required to be provided to the blue sub-pixel is 2.06 times the current required to be provided to the red sub-pixel, and the current required to be provided to the blue sub-pixel is 1.67 times the current required to be provided to the green sub-pixel. As a result, the driving transistor of the blue sub-pixel may not be able to provide such a large current because of insufficient driving capability, resulting in insufficient brightness of blue light of the display device, thereby affecting the white balance of white light.

For example, in the second example, the current efficiency of the red sub-pixel, the green sub-pixel, and the blue sub-pixel are 24 cd/A, 98 cd/A, and 5.8 cd/A, respectively.

For example, taking the area of the effective display region of the display device comprising the above array substrate being 0.031981 square meters as an example, according to the above relationship (3), the required currents of the red sub-pixel, the green sub-pixel and the blue sub-pixel can be obtained, and the required currents are 518 mA, 441 mA, and 911 mA, respectively.

According to the above parameters, assuming that the driving transistors of sub-pixels of respective colors adopt the same channel width-length ratio, the current required to be provided to the blue sub-pixel is 1.76 times the current required to be provided to the red sub-pixel and 2.06 times the current required to be provided to the green sub-pixel. As a result, the driving transistor of the blue sub-pixel may not be able to provide such a large current because of insufficient driving capability, resulting in insufficient brightness of blue light of the display device, thereby affecting the white balance of white light.

For example, in the third example, the current efficiency of the red sub-pixel, the green sub-pixel, and the blue sub-pixel are 30 cd/A, 118 cd/A, and 8 cd/A, respectively.

For example, taking the area of the effective display region of the display device comprising the above array substrate being 0.031981 square meters as an example, the required currents of the red sub-pixel, the green sub-pixel, and the blue sub-pixel can be obtained according to the above relationship (3), and the required currents are 483 mA, 467 mA, and 821 mA, respectively.

According to the above parameters, assuming that the driving transistors of sub-pixels of respective colors adopt the same channel width-length ratio, the current required to be provided to the blue sub-pixel is 1.7 times the current required to be provided to the red sub-pixel and 1.76 times the current required to be provided to the green sub-pixel. As a result, the driving transistor of the blue sub-pixel may not be able to provide such a large current because of insufficient driving capability, resulting in insufficient brightness of blue light of the display device, thereby affecting the white balance of white light.

In the embodiments of the present disclosure, the channel width-length ratio of the driving transistor of the blue sub-pixel is designed to be larger than the channel width-length ratios of the driving transistors of the sub-pixels with other colors, so that the driving transistor of the blue sub-pixel can provide the current value required for the maximum brightness or the highest gray level of the blue sub-pixel, so that the brightness of white light can reach 800 nits or more while ensuring that the white light of the display device is in the preset white balance color coordinate state.

S103: calculating a ratio of channel width-length ratios of driving transistors of sub-pixels of respective colors according to the preset brightness and the preset current efficiency of sub-pixels of respective colors.

For example, the preset current efficiency of the first color sub-pixel is E1, the preset current efficiency of the second color sub-pixel is E2, the preset brightness of the first color sub-pixel is Y1, and the preset brightness of the second color sub-pixel is Y2. According to the preset brightness and the preset current efficiency of the first color sub-pixel and the second color sub-pixel, a step of calculating the ratio of the channel width-length ratio of the first driving transistor to the channel width-length ratio of the second driving transistor comprises: setting the channel width-length ratio of the first driving transistor to be W1/L1, and the channel width-length ratio of the second driving transistor to be W2/L2; acquiring the preset data signal Vdata1 input to the first color sub-pixel, and the preset data signal Vdata2 input to the second color sub-pixel, and the preset power supply voltage Vdd input to sub-pixel of each color; and calculating the ratio according to the ratio relationship of (W1/L1):(W2/L2) that the ratio of the channel width-length ratio of the first driving transistor and the channel width-length ratio of the second driving transistor substantially satisfies.

For example, the preset current efficiency of the blue sub-pixel, the preset current efficiency of the red sub-pixel, and the preset current efficiency of the green sub-pixel are $E_B$, $E_R$, and $E_G$, respectively, and the preset brightness of the blue sub-pixel, the preset brightness of the red sub-pixel, and the preset brightness of the green sub-pixel are $Y_{[B]}$, $Y_{[R]}$ and $Y_{[G]}$, respectively.

For example, the ratio of the channel width-length ratios of the driving transistors of sub-pixels of respective colors can be calculated according to the above parameters and the relationship (5). Assuming that the preset data signal Vdata input to sub-pixel of each color is the same, and in a case where the brightness of sub-pixel of each color is at the highest brightness or the highest gray level of the display device, the channel width-length ratios of the driving transistors in the red sub-pixel, the green sub-pixel and the blue sub-pixel satisfy the following ratio relationship (13):

$$(W/L)_R:(W/L)_G:(W/L)_B=(Y_{[R]}/E_R):(Y_{[G]}/E_G):(Y_{[B]}/E_B).$$

Substituting the parameters in the first example into the relationship (13), it can be obtained:

$$(W/L)_R:(W/L)_G:(W/L)_B=1:1.24:2.06.$$

Substituting the parameters in the second example into the relationship (13), it can be obtained:

$$(W/L)_R:(W/L)_G:(W/L)_B=1:0.85:1.76.$$

Substituting the parameters in the third example into the relationship (13), it can be obtained:

$$(W/L)_R:(W/L)_G:(W/L)_B=1:0.97:1.7.$$

In the actual display process, the difference of the data signals input to sub-pixels of respective colors can be designed to be small (for example, the difference of the data signals input to the sub-pixels with different colors is not greater than 1.5V), so that sub-pixels of respective colors have substantially the same data signal range.

Considering the disparity in actual process capability, the ratio of the channel width-length ratios of the driving transistors in the red sub-pixel, the green sub-pixel and the blue sub-pixel can be set to 1:1:2. The embodiments of the present disclosure are not limited thereto, as long as the ratio of the channel width-length ratios of the driving transistors of the red sub-pixel, the green sub-pixel, and the blue sub-pixel satisfies the range of 1:(0.7~1.3):(1.5~2.5).

For example, the channel width-length ratio of the driving transistor of the blue sub-pixel can be designed to be 5/25, and the channel width-length ratios of the green sub-pixel and the red sub-pixel are designed to be 3/30 according to the ratio relationship of the channel width-length ratios of the driving transistors of the above sub-pixels with different colors. The embodiments of the present disclosure are not limited thereto, and the ratios can be adjusted according to actual process requirements. For example, the channel width-length ratio of the driving transistor of the blue sub-pixel can be designed to be in a range of 4/25~6.5/25, and the channel width-length ratio of the green sub-pixel and the red sub-pixel are both designed to be in a range of 2.4/30~4/30 according to the ratio relationship of the channel width-length ratios of the driving transistors of the above sub-pixels with different colors.

Figure 3:
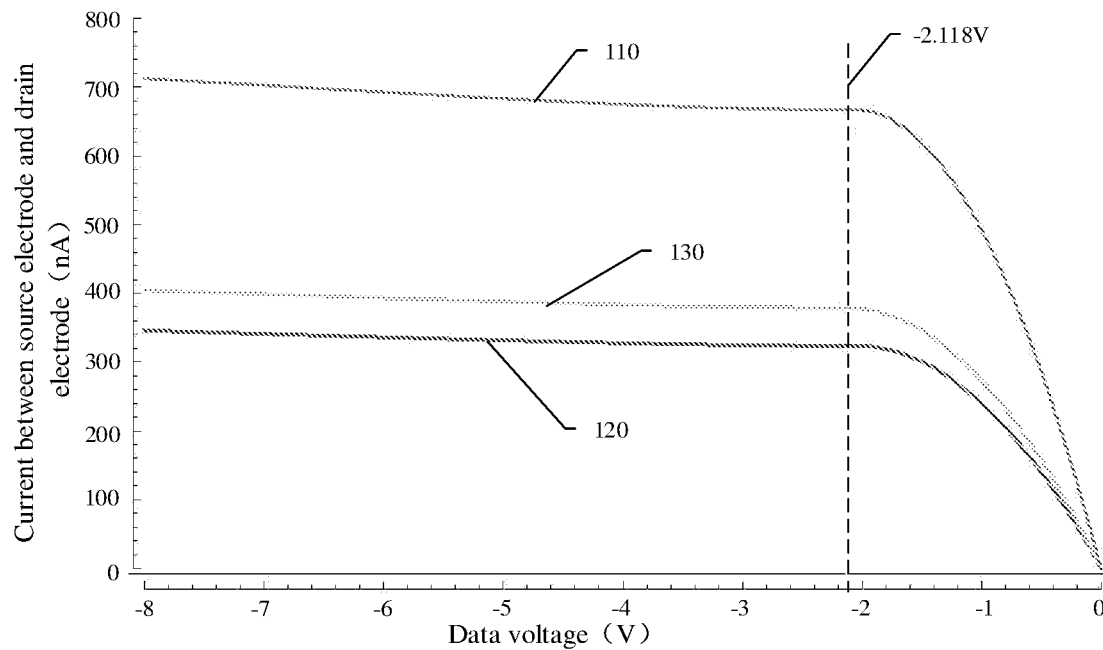
FIG. 3 is a simulation curve of a data signal input to sub-pixel of each color and a saturation current flowing through an organic light emitting element of sub-pixel of each color in a second example of an embodiment of the present disclosure.

FIG. 3 is a simulation curve of a data voltage input to sub-pixel of each color and a current flowing between the drain electrode and the source electrode of a thin film transistor for driving an organic light emitting element of sub-pixel of each color in the second example of embodiments of the present disclosure. According to the ratio relationship of the channel width-length ratios of the driving transistors of the sub-pixels in the second example (that is, $(W/L)_R:(W/L)_G:(W/L)_B \approx 1:1:2$), the channel width-length ratio of the driving transistor of sub-pixel of each color is set, thereby obtaining the simulation curve shown in FIG. 3. As shown in FIG. 3, assuming that the effective display area of the display device is 0.031981 m² and the resolution is 1920*720, in a case where the preset data voltage input to sub-pixel of each color is −2.118V, the current flowing between the drain electrode and the source electrode of the thin film transistor for driving the organic light emitting element of the blue sub-pixel is about 666.9 nanoamperes, and the current value required for all blue sub-pixels is 666.9*1920*720 nanoamperes, that is, 921 milliamperes; the current flowing between the drain electrode and the source electrode of the thin film transistor for driving the organic light emitting element of the red sub-pixel is about 322.9 milliamperes, and the current value required for all red sub-pixels is 322.9*1920*720 nanoamperes, that is, 446 milliamperes; and the current flowing between the drain electrode and the source electrode of the thin film transistor for driving the organic light emitting element of the green sub-pixel is about 3783 milliamperes, and the current value required for all green sub-pixels is 378.3*1920*720 nanoamperes, that is, 523 milliamperes. The result in this simulation curve roughly matches the value of the current required by sub-pixel of each color in the second example. Therefore, by designing the channel width-length ratio of the driving transistor of the blue sub-pixel to be larger than the channel width-length ratios of the driving transistors of the sub-pixels with other colors, the driving transistor of the blue sub-pixel can provide the current value required for the maximum brightness or the highest gray scale of the blue sub-pixel, so that the brightness of white light can reach 800 nits or more while ensuring that the white light is in the white balance state.

Figure 4:
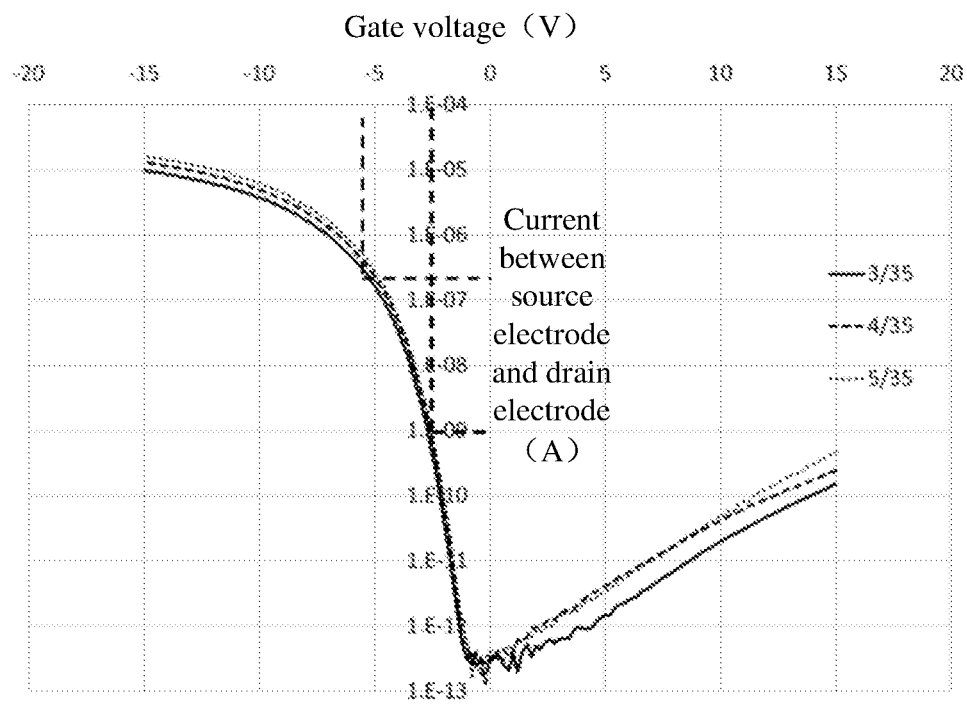
FIG. 4 is a curve of gate electrode voltages and saturation currents of driving transistors with different channel width-length ratios provided by an embodiment of the present disclosure.

FIG. 4 is a curve of gate voltages and currents between the drain electrode and source electrode of driving transistors with different channel width-length ratios. The different curves in FIG. 4 respectively represent different channel width-length ratios. As shown in FIG. 4, in a driving transistor with a channel width-length ratio of 3/35, the threshold voltage of the driving transistor is −2.47094V, and the gate voltage of the driving transistor is −5.9V; in a driving transistor with a channel width-length ratio of 4/35, the threshold voltage of the driving transistor is −2.5126V, and the gate voltage of the driving transistor is −5.9V; and in a driving transistor with a channel width-length ratio of 5/35, the threshold voltage of the driving transistor is −2.4872V, and the gate voltage of the driving transistor is −5.4V. It can be known from the values of the gate voltage and the threshold voltage of each driving transistor that changing the channel width-length ratio of the driving transistor basically does not affect the driving characteristics of the driving transistor.

Figure 5A:
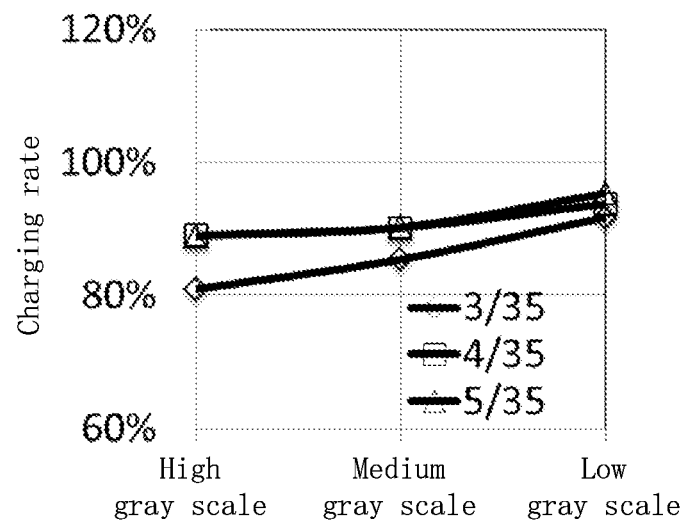
FIG. 5A-FIG. 5C are relationship diagrams of a channel width-length ratio of a driving transistor and a charging rate in sub-pixel of each color.
Figure 5B:
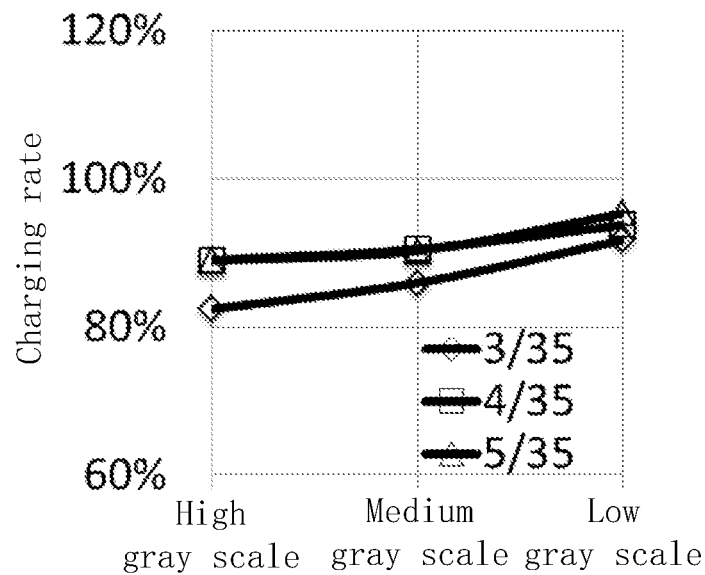
Figure 5C:
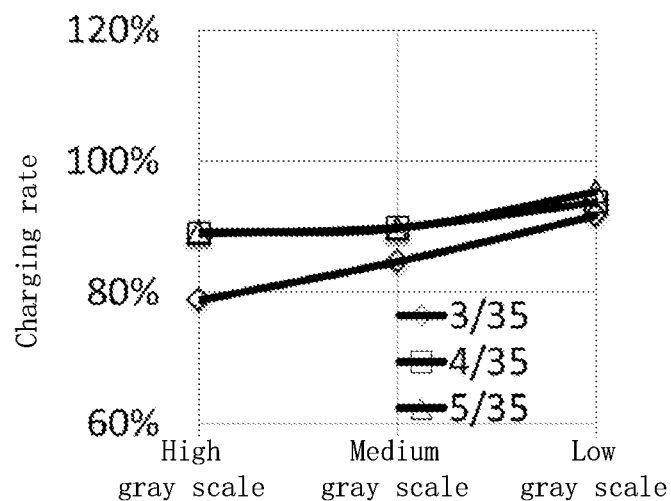

FIG. 5A-FIG. 5C are relationship diagrams of a channel width-length ratio and a charging rate of a driving transistor in sub-pixel of each color. FIG. 5A shows a change of charging rates of driving transistors with different channel width-length ratios in a case where data signals corresponding to a high gray scale (for example, 255 gray scale), a medium gray scale (for example, 128 gray scale) and a low gray scale (for example, 32 gray scale) are written to the driving circuit of the red sub-pixel. As shown in FIG. 5A, the charging rate in a case where the channel width-length ratio of the driving transistor is 5/35 or 4/35 is larger than the charging rate in a case where the channel width-length ratio of the driving transistor is 3/35. Similarly, FIG. 5B shows a change of charging rates of driving transistors with different channel width-length ratios in a case where data signals corresponding to a high gray scale (for example, 255 gray scale), a medium gray scale (for example, 128 gray scale) and a low gray scale (for example, 32 gray scale) are written to the driving circuit of the green sub-pixel. As shown in FIG. 5B, the charging rate in a case where the channel width-length ratio of the driving transistor is 5/35 or 4/35 is larger than the charging rate in a case where the channel width-length ratio of the driving transistor is 3/35. FIG. 5C shows a change of charging rates of driving transistors with different channel width-length ratios in a case where data signals corresponding to a high gray scale (for example, 255 gray scale), a medium gray scale (for example, 128 gray scale) and a low gray scale (for example, 32 gray scale) are written to the driving circuit of the blue sub-pixel. As shown in FIG. 5C, the charging rate in a case where the channel width-length ratio of the driving transistor is 5/35 or 4/35 is larger than the charging rate in a case where the channel width-length ratio of the driving transistor is 3/35. It can be seen that, in the process of changing the channel width-length ratio of the driving transistor of sub-pixel of each color to meet the ratio relationship, it may be considered to increase the channel width-length ratio (for example, increasing the channel width) to increase the charging rate of the driving transistor, thereby reducing the charging time.

Another embodiment of the present disclosure provides an organic light emitting diode display device, which comprises the array substrate as mentioned above.

In some examples, the organic light emitting diode display device is a vehicle mounted display device.

In the embodiments of the present disclosure, by designing the channel width-length ratios of the driving transistors of sub-pixels with different colors to be different, the phenomenon of insufficient brightness of blue light when a high-brightness image is displayed on the display screen of the vehicle display device can be avoided as much as possible.

Of course, the embodiments of the present disclosure are not limited to the organic light emitting diode display device being a vehicle mounted display device, the organic light emitting diode display device may also be any product or component with a display function, such as a digital camera, a mobile phone, a watch, a tablet computer, a notebook computer, etc. The embodiments are not limited thereto.

Figure 6:
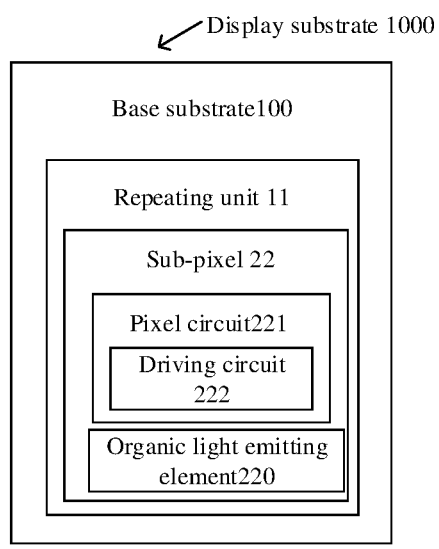
FIG. 6 is a schematic block diagram of a display substrate provided by an embodiment of the present disclosure.
Figure 7:
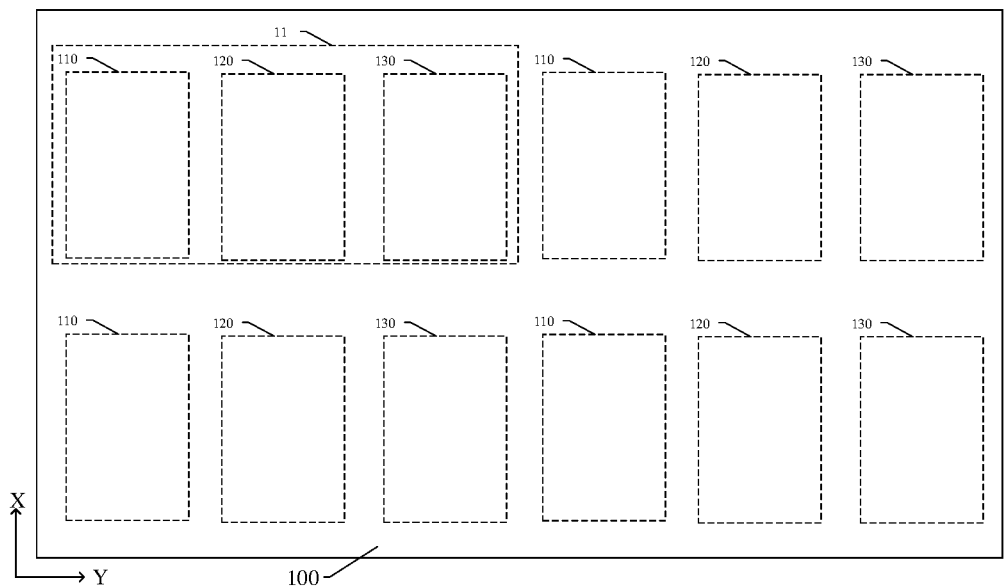
FIG. 7 is a schematic diagram of repeating units of a display substrate provided by an embodiment of the present disclosure.
Figure 8:
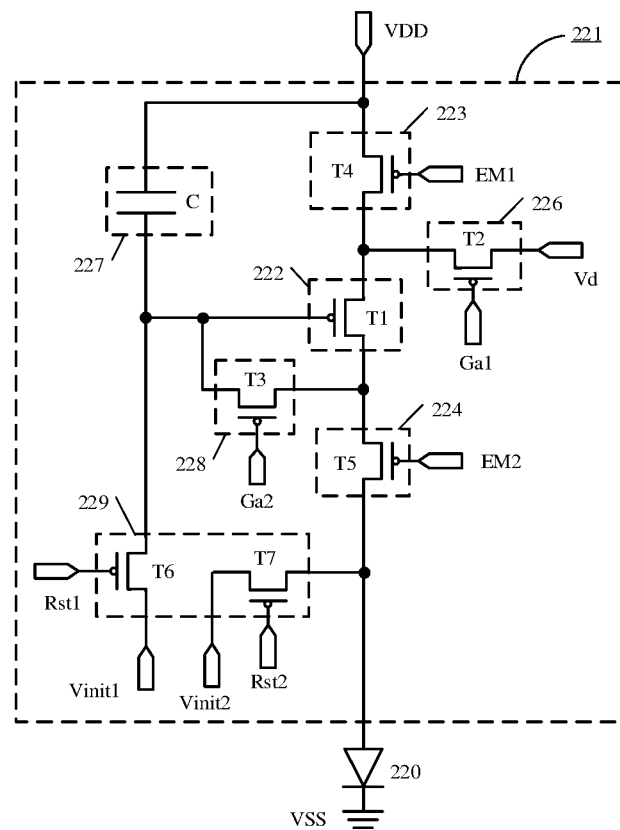
FIG. 8 is a planar diagram of a display substrate provided by an embodiment of the present disclosure.

Another embodiment of the present disclosure provides a display substrate. FIG. 6 is a schematic block diagram of a display substrate provided by an embodiment of the present disclosure; FIG. 7 is a schematic diagram of repeating units of a display substrate provided by an embodiment of the present disclosure; and FIG. 8 is a planar diagram of a display substrate provided by an embodiment of the present disclosure.

For example, as shown in FIG. 6-FIG. 7, a display substrate 1000 provided by the embodiments of the present disclosure comprises a base substrate 100 and a plurality of repeating units 11 disposed along a first direction (that is, Y direction) and a second direction (that is, X) on the base substrate 100, the first direction intersects the second direction. For example, the first direction is perpendicular to the second direction. Each repeating unit 11 comprises a plurality of sub-pixels 22, for example, comprising a first color sub-pixel 110 and a second color sub-pixel 120. Sub-pixel 22 of each color comprises an organic light emitting element 220 and a pixel circuit 221. The pixel circuit 221 is used to drive the organic light emitting element 220 to emit light. The pixel circuit 221 comprises a driving circuit 222. The driving circuit 222 of the first color sub-pixel 110 comprises a first driving transistor 111, the driving circuit 222 of the second color sub-pixel 120 comprises a second driving transistor 121, and a channel width-length ratio of the first driving transistor 111 is greater than a channel width-length ratio of the second driving transistor 121. The embodiments of the present disclosure can improve the brightness of the display device comprising the display substrate by optimizing the channel width-length ratio of the driving transistors of the sub-pixels with different colors on the display substrate.

The relationship of the channel width-length ratio of the first driving transistor and the channel width-length ratio of the second driving transistor in the embodiment of the present disclosure is the same as the relationship of the channel width-length ratio of the first driving transistor and the channel width-length ratio of the second driving transistor in the embodiment shown in FIG. 1A-FIG. 1E, which is not be repeated here.

For example, the display substrate 1000 may be applied to a display panel, such as an active matrix organic light emitting diode (AMOLED) display panel and the like. The display substrate 1000 may be an array substrate.

For example, the base substrate 100 may be a suitable substrate such as a glass substrate, a quartz substrate, a plastic substrate, or the like.

For example, as shown in FIG. 7, each repeating unit 11 further comprises a third color sub-pixel 130, and the third color sub-pixel 130 comprises a third driving transistor 131, a channel width-length ratio of the third driving transistor 131 is less than the channel width-length ratio of the first driving transistor 111.

The relationship of the channel width-length ratio of the first driving transistor, the channel width-length ratio of the second driving transistor, and the channel width-length ratio of the third driving transistor in the embodiment of the present disclosure is the same as the relationship of the channel width-length ratio of the first driving transistor, the channel width-length ratio of the second driving transistor, and the channel width-length ratio of the third driving transistor in the embodiment shown in FIG. 1A-FIG. 1E, which is not be repeated here.

For example, as shown in FIG. 7, in each repeating unit 11, a pixel circuit of the first color sub-pixel 110, a pixel circuit of the second color sub-pixel 120, and a pixel circuit of the third color sub-pixel 130 are disposed sequentially along the first direction (the direction indicated by the arrow in the Y direction). For example, a column of sub-pixels disposed in the X direction are sub-pixels with the same color.

For example, a region covered by an orthographic projection of the pixel circuit of sub-pixel of each color on the base substrate 100 is substantially within a rectangle (as shown by the dashed frame 1101 in FIG. 10). It should be noted that some signal lines of the pixel circuit comprise portions located inside the rectangle and portions extending outside the rectangle, so the orthographic projection of the pixel circuit on the base substrate here mainly comprises orthographic projections of structures such as various transistors, capacitors and the like on the base substrate and orthographic projections of the portions of each signal line within the rectangle on the base substrate.

For example, the organic light emitting element 220 of each sub-pixel 22 comprises a first electrode, a second electrode, and a light emitting layer between the first electrode and the second electrode. One of the first electrode and the second electrode of the organic light emitting element 220 is electrically connected to the driving transistor. The example shown in FIG. 7-FIG. 9E is described by taking the second electrode of the organic light emitting element being connected to the driving transistor as an example.

For example, as shown in FIG. 8, the pixel circuit 221 further comprises a second light emitting control circuit 223 and a first light emitting control circuit 224. The driving circuit 222 comprises a control terminal, a first terminal, and a second terminal, and is configured to provide a driving current for driving the light emitting element 220 to emit light. For example, the second light emitting control circuit 223 is connected to a first terminal of the driving circuit 222 and a first voltage terminal VDD, and is configured to turn on or turn off a connection between the driving circuit 222 and the first voltage terminal VDD, and the first light emitting control circuit 224 is electrically connected to a second terminal of the driving circuit 222 and a first electrode of the light emitting element 220, and is configured to turn on or turn off a connection between the driving circuit 222 and the light emitting element 220.

For example, as shown in FIG. 8, the pixel circuit 221 further comprises a data writing circuit 226, a storage circuit 227, a threshold compensation circuit 228, and a reset circuit 229. The data writing circuit 226 is electrically connected to the first terminal of the drive circuit 222 and is configured to write a data signal into the storage circuit 227 under the control of a scanning signal; the storage circuit 227 is electrically connected to a control terminal of the driving circuit 222 and the first voltage terminal VDD, and is configured to store the data signal; the threshold compensation circuit 228 is electrically connected to the control terminal and a second terminal of the driving circuit 222, and is configured to perform threshold compensation on the driving circuit 222; and the reset circuit 229 is electrically connected to the control terminal of the driving circuit 222 and the first electrode of the light emitting element 220, and is configured to reset the control terminal of the driving circuit 222 and the first electrode of the light emitting element 220 under the control of a reset control signal.

For example, as shown in FIG. 8, the driving circuit 222 comprises a driving transistor T1, the control terminal of the driving circuit 222 comprises a gate electrode of the driving transistor T1, the first terminal of the driving circuit 222 comprises a first electrode of the driving transistor T1, and the second terminal of the driving circuit 222 comprises a second electrode of the driving transistor T1.

For example, as shown in FIG. 8, the data writing circuit 226 comprises a data writing transistor T2, the storage circuit 227 comprises a storage capacitor C, the threshold compensation circuit 228 comprises a threshold compensation transistor T3, the second light emitting control circuit 223 comprises a second light emitting control transistor T4, the first light emitting control circuit 224 comprises a first light emitting control transistor T5, the reset circuit 229 comprises a first reset transistor T6 and a second reset transistor T7, and the reset control signal may comprise a first sub-reset control signal and a second sub-reset control signal.

For example, as shown in FIG. 8, a first electrode of the data writing transistor T2 is electrically connected to the first electrode of the driving transistor T1, a second electrode of the data writing transistor T2 is configured to be electrically connected to a data line Vd to receive the data signal, and a gate electrode of the data writing transistor T2 is configured to be electrically connected to a first scanning signal line Ga1 to receive the scanning signal; a first electrode of the storage capacitor C is electrically connected to the first voltage terminal VDD, and a second electrode of the storage capacitor C is electrically connected to the gate electrode of the driving transistor T1; a first electrode of the threshold compensation transistor T3 is electrically connected to the second electrode of the driving transistor T1, a second electrode of the threshold compensation transistor T3 is electrically connected to the gate electrode of the driving transistor T1, and a gate electrode of the threshold compensation transistor T3 is configured to be electrically connected to a second scanning signal line Ga2 to receive a compensation control signal; a first electrode of the first reset transistor T6 is configured to be electrically connected to a first reset power supply terminal Vinit1 to receive a first reset signal, a second electrode of the first reset transistor T6 is electrically connected to the gate electrode of the driving transistor T1, and a gate electrode of the first reset transistor T6 is configured to be electrically connected to a first reset control signal line Rst1 to receive a first sub-reset control signal; a first electrode of the second reset transistor T7 is configured to be electrically connected to a second reset power supply terminal Vinit2 to receive a second reset signal, a second electrode of the second reset transistor T7 is electrically connected to the first electrode of the light emitting element 220, and a gate electrode of the second reset transistor T7 is configured to be electrically connected to a second reset control signal line Rst2 to receive a second sub-reset control signal; a first electrode of the second light emitting control transistor T4 is electrically connected to the first voltage terminal VDD, a second electrode of the second light emitting control transistor T4 is electrically connected to the first electrode of the driving transistor T1, and a gate electrode of the second light emitting control transistor T4 is configured to be electrically connected to a first light emitting control signal line EM1 to receive a first light emitting control signal; a first electrode of the first light emitting control transistor T5 is electrically connected to the second electrode of the driving transistor T1, a second electrode of the first light emitting control transistor T5 is electrically connected to the second electrode of the light emitting element 220, and a gate electrode of the first light emitting control transistor T5 is configured to be electrically connected to a second light emitting control signal line EM2 to receive a second light emitting control signal; and the first electrode of the light emitting element 220 is electrically connected to a second voltage terminal VSS.

For example, one of the first voltage terminal VDD and the second voltage terminal VSS is a high voltage terminal and the other of the first voltage terminal VDD and the second voltage terminal VSS is a low voltage terminal. For example, in the embodiment as shown in FIG. 8, the first voltage terminal VDD is a voltage source to output a constant first voltage, and the first voltage is a positive voltage; and the second voltage terminal VSS may be a voltage source to output a constant second voltage, the second voltage is a negative voltage or the like. For example, in some examples, the second voltage terminal VSS may be grounded.

For example, as shown in FIG. 8, the scanning signal may be the same as the compensation control signal, that is, the gate electrode of the data writing transistor T2 and the gate electrode of the threshold compensation transistor T3 may be electrically connected to the same signal line, such as the first scanning signal line Ga1, to receive the same signal (e.g., scanning signal), in this case, the display substrate 1000 may not be provided with the second scanning signal line Ga2, thereby reducing the number of signal lines. For another example, the gate electrode of the data writing transistor T2 and the gate electrode of the threshold compensation transistor T3 may be electrically connected to different signal lines, i.e., the gate electrode of the data writing transistor T2 is electrically connected to the first scanning signal line Ga1, the gate electrode of the threshold compensation transistor T3 is electrically connected to the second scanning signal line Ga2, and a signal transmitted by the first scanning signal line Ga1 is the same as a signal transmitted by the second scanning signal line Ga2.

It should be noted that the scanning signal and the compensation control signal may also be different, so that the gate electrode of the data writing transistor T2 and the gate electrode of the threshold compensation transistor T3 can be separately and independently controlled, thereby increasing the flexibility of controlling the pixel circuit.

For example, as shown in 8, the first light emitting control signal may be the same as the second light emitting control signal, that is, the gate electrode of the second light emitting control transistor T4 and the gate electrode of the first light emitting control transistor T5 may be electrically connected to the same signal line, such as the first light emitting control signal line EM1, to receive the same signal (e.g., the first light emitting control signal), and in this case, the display substrate 1000 may not be provided with the second light emitting control signal line EM2, thereby reducing the number of signal lines. For another example, the gate electrode of the second light emitting control transistor T4 and the gate electrode of the first light emitting control transistor T5 may also be electrically connected to different signal lines, i.e., the gate electrode of the second light emitting control transistor T4 is electrically connected to the first light emitting control signal line EM1, the gate electrode of the first light emitting control transistor T5 is electrically connected to the second light emitting control signal line EM2, and a signal transmitted by the first light emitting control signal line EM1 is the same as a signal transmitted by the second light emitting control signal line EM2.

It should be noted that in a case where the second light emitting control transistor T4 and the first light emitting control transistor T5 are transistors with different types, for example, in a case where the second light emitting control transistor T4 is a P-type transistor and the first light emitting control transistor T5 is an N-type transistor, the first light emitting control signal and the second light emitting control signal may also be different, and the embodiments of the present disclosure are not limited thereto.

For example, the first sub-reset control signal may be the same as the second sub-reset control signal, that is, the gate electrode of the first reset transistor T6 and the gate electrode of the second reset transistor T7 may be electrically connected to the same signal line, such as the first reset control signal line Rst1, to receive the same signal (e.g., the first sub-reset control signal). In this case, the display substrate 1000 may not be provided with the second reset control signal line Rst2, thereby reducing the number of signal lines. For another example, the gate electrode of the first reset transistor T6 and the gate electrode of the second reset transistor T7 may be electrically connected to different signal lines, i.e., the gate electrode of the first reset transistor T6 is electrically connected to the first reset control signal line Rst1, the gate electrode of the second reset transistor T7 is electrically connected to the second reset control signal line Rst2, and a signal transmitted by the first reset control signal line Rst1 is the same as a signal transmitted by the second reset control signal line Rst2. It should be noted that the first sub-reset control signal and the second sub-reset control signal may also be different.

For example, in some examples, the second sub-reset control signal may be the same as the scanning signal, that is, the gate electrode of the second reset transistor T7 may be electrically connected to the first scanning signal line Ga1 to receive the scanning signal as the second sub-reset control signal.

For example, the source electrode of the first reset transistor T6 and the source electrode of the second reset transistor T7 are connected to the first reset power supply terminal Vinit1 and the second reset power supply terminal Vinit2, respectively. The first reset power supply terminal Vinit1 and the second reset power supply terminal Vinit2 may be DC reference voltage terminals to output constant DC reference voltages. The first reset power supply terminal Vinit1 and the second reset power supply terminal Vinit2 may be the same, for example, the source electrode of the first reset transistor T6 and the source electrode of the second reset transistor T7 are connected to the same reset power supply terminal. The first reset power supply terminal Vinit1 and the second reset power supply terminal Vinit2 may be high voltage terminals or low voltage terminals, as long as the first reset power supply terminal Vinit1 and the second reset power supply terminal Vinit2 can provide the first reset signal and the second reset signal to reset the gate electrode of the driving transistor T1 and the second electrode of the light emitting element 220, and the present disclosure is not limited thereto.

It should be noted that the driving circuit 222, the data writing circuit 226, the storage circuit 227, the threshold compensation circuit 228, and the reset circuit 229 in the pixel circuit as shown in FIG. 8 are only schematic. The specific structures of the driving circuit 222, the data writing circuit 226, the storage circuit 227, the threshold compensation circuit 228, and the reset circuit 229 can be set according to actual application requirements, and the embodiments of the present disclosure are not specifically limited thereto.

For example, according to the characteristics of transistors, transistors can be divided into N-type transistors and P-type transistors. For the sake of clarity, the embodiments of the present disclosure illustrate the technical solution of the present disclosure by taking a case that transistors are P-type transistors (e.g., P-type MOS transistors) as an example, that is, in the descriptions of the present disclosure, the driving transistor T1, the data writing transistor T2, the threshold compensation transistor T3, the second light emitting control transistor T4, the first light emitting control transistor T5, the first reset transistor T6, the second reset transistor T7, etc. may be P-type transistors. However, the transistors of the embodiments of the present disclosure are not limited to P-type transistors, and those skilled in the art may also use N-type transistors (e.g., N-type MOS transistors) to achieve the functions of one or more transistors in the embodiments of the present disclosure according to actual needs.

It should be noted that the transistors used in the embodiments of the present disclosure may be thin film transistors or field effect transistors or other switching devices with the same characteristics, and the thin film transistors may comprise oxide semiconductor thin film transistors, amorphous silicon thin film transistors, or polysilicon thin film transistors, etc. A source electrode and a drain electrode of a transistor can be symmetrical in structure, so the source electrode and the drain electrode of the transistor can be indistinguishable in physical structure. In the embodiments of the present disclosure, in order to distinguish two electrodes of transistors, except for a gate electrode serving as a control electrode, one of the two electrodes is directly described as a first electrode, and the other of the two electrodes is described as a second electrode, so the first electrodes and the second electrodes of all or part of the transistors in the embodiments of the present disclosure are interchangeable as required.

It should be noted that in the embodiments of the present disclosure, in addition to the 7T1C structure as shown in FIG. 8 (i.e., comprising seven transistors and one capacitor), the pixel circuit of the sub-pixel may also have a structure comprising other numbers of transistors, such as a 7T2C structure, a 6T1C structure, a 6T2C structure or a 9T2C structure, the embodiments of the present disclosure are not limited thereto.

Figure 9A:
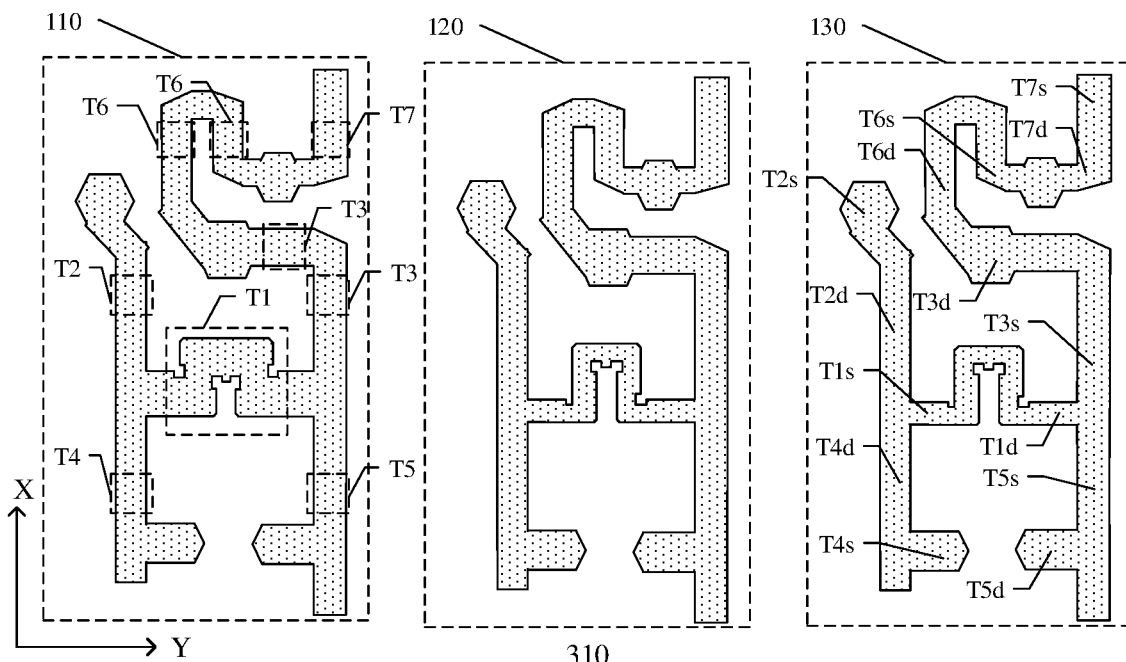

FIG. 9A-FIG. 10A are schematic diagrams of various layers of a pixel circuit provided by some embodiments of the present disclosure. The positional relationship of the respective circuits in the pixel circuit on a backplane will be described below with reference to FIG. 9A-FIG. 10A. The example shown in FIG. 9A-FIG. 10A takes pixel circuits 221 of one repeating unit 11 as an example, and the position of each transistor of the pixel circuit in the first color sub-pixel 110 is illustrated, and the components of the pixel circuits in the sub-pixels with other colors are substantially the same as the positions of the transistors in the first color sub-pixel. As shown in FIG. 9A, the pixel circuit 221 of the first color sub-pixel 110 comprises a driving transistor T1, a data writing transistor T2, a threshold compensation transistor T3, a second light emitting control transistor T4, and a first light emitting control transistor T5, a first reset transistor T6 and a second reset transistor T7, and a storage capacitor C, as shown in FIG. 8.

FIG. 9A-FIG. 10A also show the first scanning signal line Ga1, the second scanning signal line Ga2, the first reset control signal line Rst1, the second reset control signal line Rst2, the first reset power signal line Init1 of the first reset power supply terminal Vinit1, the second reset power signal line Init2 of the second reset power supply terminal Vinit2, the first lighting control signal line EM1, the second lighting control signal line EM2, the data line Vd, the first power signal line VDD1 of the first power supply terminal VDD, the second power signal line VDD2, the third power signal line VDD3 (that is the power line), and the shielding line 344 that are electrically connected to the pixel circuit 121 of sub-pixel of each color. The first power signal line VDD1 and the second power signal line VDD2 are electrically connected with each other, and the first power signal line VDD1 and the third power signal line VDD3 are electrically connected with each other. The power supply line VDD3 overlaps with the data line Vd in a third direction perpendicular to the base substrate.

It should be noted that in the example shown in FIG. 9A-FIG. 9E, the first scanning signal line Ga1 and the second scanning signal line Ga2 are the same signal line, the first reset power signal line Init1 and the second reset power signal line Init2 are the same signal line, the first reset control signal line Rst1 and the second reset control signal line Rst2 are the same signal line, and the first light emitting control signal line EM1 and the second light emitting control signal line EM2 are the same signal line, but the embodiments are not limited to thereto.

For example, FIG. 9A shows an active semiconductor layer 310 of the pixel circuit in the display substrate. The active semiconductor layer 310 may be patterned using a semiconductor material. The active semiconductor layer 310 may be used to form active layers of the above-mentioned driving transistor T1, the data writing transistor T2, the threshold compensation transistor T3, the second light emitting control transistor T4, the first light emitting control transistor T5, the first reset transistor T6, and the second reset transistor T7. The active semiconductor layer 310 comprises an active layer pattern and a doped region pattern (that is, a source region s and a drain region d shown in the third color sub-pixel) of the transistors of respective sub-pixels, and the active layer pattern and the doped region pattern of respective transistors in the same pixel circuit are provided integrally.

It should be noted that the active layer may comprise an integrally formed low-temperature polysilicon layer, and the source region and the drain region therein may be conductive by doping or the like to realize electrical connection of each structure. That is, the active semiconductor layer of transistors of each sub-pixel is an integrated pattern formed of p-silicon, and each transistor in the same pixel circuit comprises doped region patterns (that is, the source region s and the drain region d) and the active layer pattern, and the active layers of different transistors are separated by a doped structure.

For example, the active semiconductor layers in the pixel circuits of the sub-pixels with different colors disposed along the first direction have no connection relationship and are disconnected from each other. The active semiconductor layers in the pixel circuits of sub-pixels of the same color disposed along the second direction may be provided integrally, or may be disconnected from each other.

For example, the active semiconductor layer 310 may be prepared by amorphous silicon, polysilicon, oxide semiconductor material, or the like. It should be noted that the above-mentioned source region and drain region may be regions doped with n-type impurities or p-type impurities.

Figure 9B:
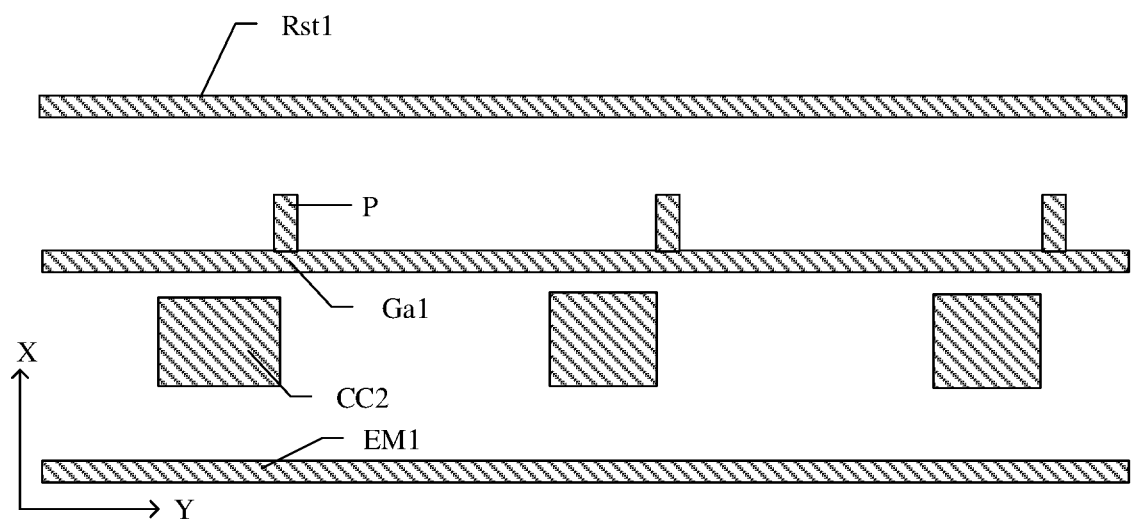

For example, a gate electrode metal layer of the pixel circuit may comprise a first conductive layer and a second conductive layer. A gate insulating layer (as shown in FIG. 10B and FIG. 10C) is formed on the active semiconductor layer 310 to protect the active semiconductor layer 310. FIG. 9B shows a first conductive layer 320 of the display substrate, the first conductive layer 320 is disposed on the gate insulating layer, so as to be insulated from the active semiconductor layer 310. The first conductive layer 320 may comprise a second electrode CC2 of the storage capacitor C, the first scanning signal line Ga1, the first reset control signal line Rst1, the first light emitting control signal line EM1, and gate electrodes of the driving transistor T1, the data writing transistor T2, the threshold compensation transistor T3, the second light emitting control transistor T4, the first light emitting control transistor T5, the first reset transistor T6, and the second reset transistor T7.

For example, as shown in FIG. 9B, the gate electrode of the data writing transistor T2 may be a portion of the first scanning signal line Ga1 that overlaps with the active semiconductor layer 310, the gate electrode of the second light emitting control transistor T4 may be a first portion of the first light emitting control signal line EM1 that overlaps with the active semiconductor layer 310, the gate electrode of the first light emitting control transistor T5 may be a second portion of the first light emitting control signal line EM1 that overlaps with the active semiconductor layer 310, the gate electrode of the first reset transistor T6 may be a first portion of the first reset control signal line Rst1 that overlaps with the active semiconductor layer 310, the gate electrode of the second reset transistor T7 is a second portion of the first reset control signal line Rst1 that overlaps with the active semiconductor layer 310. The threshold compensation transistor T3 may be a thin film transistor with a double gate structure, a first gate electrode of the threshold compensation transistor T3 may be a portion of the first scanning signal line Ga1 that overlaps with the active semiconductor layer 310, and a second gate electrode of the threshold compensation transistor T3 may be a portion of a protrusion portion protruding from the first scanning signal line Ga1 that overlaps with the active semiconductor layer 310. As shown in FIG. 8 and FIG. 9B, the gate electrode of the driving transistor T1 may be the second electrode CC2 of the storage capacitor C.

It should be noted that respective dashed rectangular frames in FIG. 9A show respective portions of the first conductive layer 320 that overlap with the active semiconductor layer 310.

For example, as shown in FIG. 9B, the first scanning signal line Ga1, the first reset control signal line Rst1, and the first light emitting control signal line EM1 are disposed along the second direction X. The first scanning signal line Ga1 is located between the first reset control signal line Rst1 and the first light emitting control signal line EM1.

For example, in the second direction X, the second electrode CC2 of the storage capacitor C (i.e., the gate electrode of the driving transistor T1) is located between the first scanning signal line Ga1 and the first light emitting control signal line EM1. The protrusion portion P protruding from the first scanning signal line Ga1 is located on a side of the first scanning signal line Ga1 away from the first light emitting control signal line EM1.

For example, as shown in FIG. 9A, in the second direction X, the gate electrode of the data writing transistor T2, the gate electrode of the threshold compensation transistor T3, the gate electrode of the first reset transistor T6, and the gate electrode of the second reset transistor T7 are all located on a first side of the gate electrode of the driving transistor T1, the gate electrode of the second light emitting control transistor T4 and the gate electrode of the first light emitting control transistor T5 are both located on a second side of the gate electrode of the driving transistor T1. For example, in the example as shown in FIG. 9A-FIG. 10A, the first side and the second side of the gate electrode of the driving transistor T1 in the pixel circuit of the first color sub-pixel are opposite sides of the gate electrode of the driving transistor T1 in the second direction X. For example, as shown in FIG. 9A-FIG. 10A, in the XY plane, the first side of the gate electrode of the driving transistor T1 in the pixel circuit of the first color sub-pixel may be an upper side of the gate electrode of the driving transistor T1, and the second side of the gate electrode of the driving transistor T1 in the pixel circuit of the first color sub-pixel may be a lower side of the gate electrode of the driving transistor T1. For the lower side, for example, the side of the display substrate for bonding an IC is the lower side of the display substrate, and the lower side of the gate electrode of the driving transistor T1 is the side of the gate electrode in the driving transistor T1 close to the IC. The upper side is the opposite side of the lower side, for example, is the side of the gate electrode of the driving transistor T1 away from the IC.

For example, in some embodiments, as shown in FIG. 9A-FIG. 10A, in a first direction Y, the gate electrode of the data writing transistor T2 and the gate electrode of the second light emitting control transistor T4 are both located on a third side of the gate electrode of the driving transistor T1, the first gate electrode of the threshold compensation transistor T3, the gate electrode of the first light emitting control transistor T5, and the gate electrode of the second reset transistor T7 are all located on a fourth side of the gate electrode of the driving transistor T1. For example, in the example shown in FIG. 9A-FIG. 10A, the third side and the fourth side of the gate electrode of the driving transistor T1 in the pixel circuit of the first color sub-pixel are opposite sides of the gate electrode of the driving transistor T1 in the first direction Y. For example, as shown in FIG. 9A-FIG. 10A, the third side of the gate electrode of the driving transistor T1 in the pixel circuit of the first color sub-pixel may be a left side of the gate electrode of the driving transistor T1 in the pixel circuit of the first color sub-pixel, and the fourth side of the gate electrode of the driving transistor T1 in the pixel circuit of the first color sub-pixel may be a right side of the gate electrode of the driving transistor T1 in the pixel circuit of the first color sub-pixel. For the left side and the right side, for example, in the same pixel circuit, the data line is on the left side of the first power signal line VDD1, and the first power signal line VDD1 is on the right side of the data line.

Figure 9C:
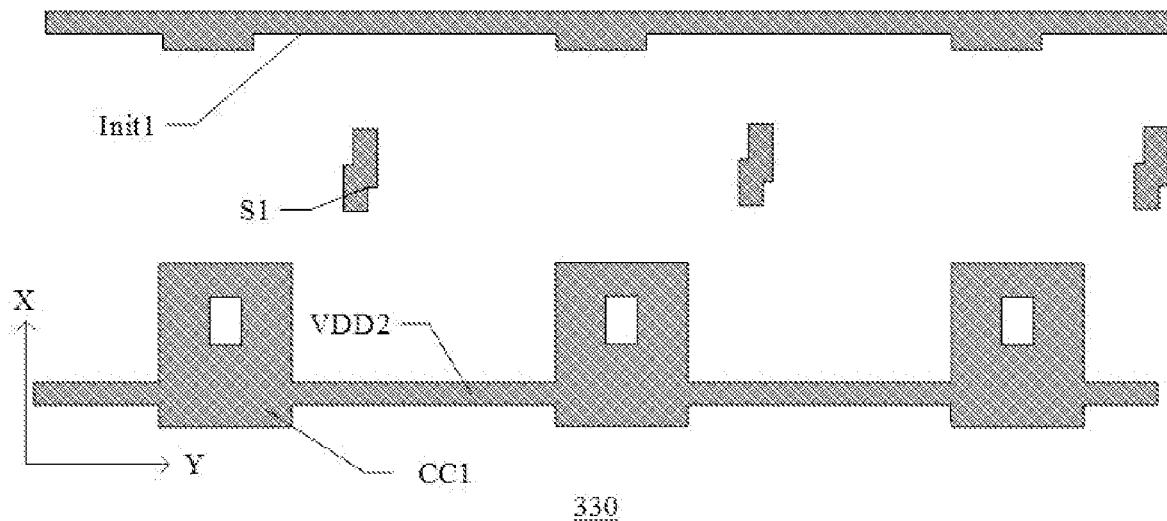

For example, a first insulating layer (as shown in FIG. 10B and FIG. 10C) is formed on the first conductive layer 320 to protect the first conductive layer 320 as mentioned above. FIG. 9C shows a second conductive layer 330 of the pixel circuit. The second conductive layer 330 comprises a first electrode CC1 of the storage capacitor C, the first reset power signal line Init1, the second power signal line VDD2, and a light shielding portion S. The second power signal line VDD2 and the first electrode CC1 of the storage capacitor C are formed integrally. The first electrode CC1 of the storage capacitor C and the second electrode CC2 of the storage capacitor C at least partially overlap with each other to form the storage capacitor C.

Figure 9D:
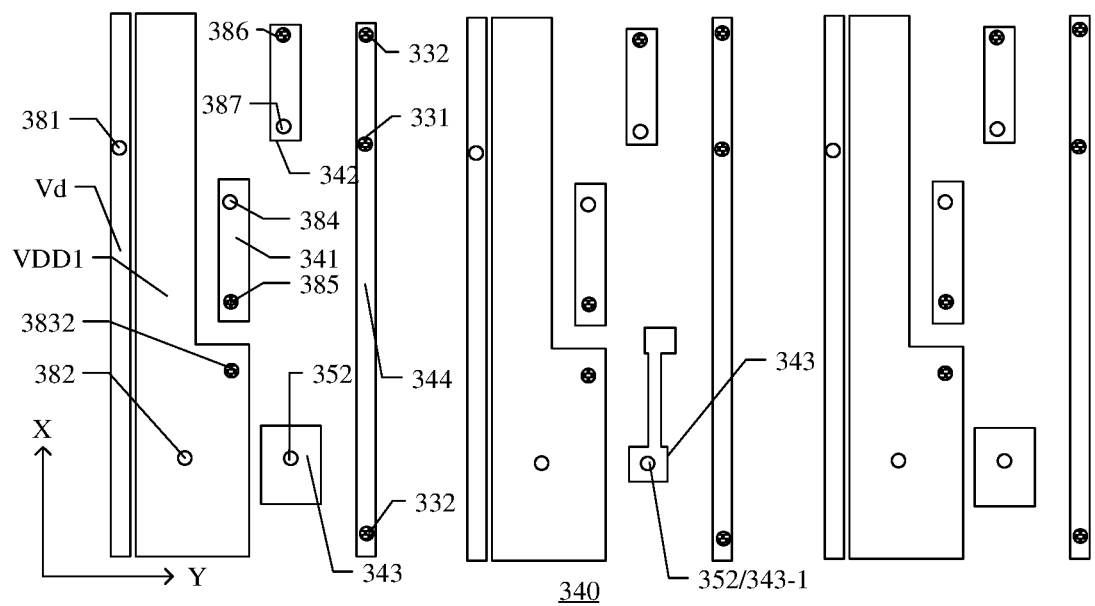

For example, a second insulating layer (as shown in FIG. 10B and FIG. 10C) is formed on the second conductive layer 330 to protect the second conductive layer 330. FIG. 9D shows a source-drain electrode metal layer 340 of the pixel circuit, and the source-drain electrode metal layer 340 comprises the data line Vd, the first power signal line VDD1, and the shielding line 334. The abovementioned data line Vd, the first power signal line VDD1, and the shielding line 334 extend along the X direction. The shielding line 344 and the data line Vd are formed in the same layer and have the same material, so that the shielding line and the data line can be formed simultaneously in the same patterning process, thereby avoiding adding an additional patterning process for manufacturing the shielding line, simplifying the manufacturing process of the display substrate, and saving the manufacturing cost.

For example, the source-drain electrode metal layer 340 further comprises a first connection portion 341, a second connection portion 342, and a third connection portion 343 (that is the connection structure 343). FIG. 9D also shows exemplary locations of a plurality of vias, and the source-drain metal layer 340 is connected to a plurality of film layers between the source-drain metal layer 340 and the base substrate through the plurality of vias as illustrated. As shown in FIG. 9D, differently filled vias indicate that the source-drain metal layer 340 is connected to different film layers through the vias. For example, the source-drain metal layer 340 is connected to the active semiconductor layer 310 shown in FIG. 9A through vias filled white color, and the source-drain metal layer 340 is connected to the second semiconductor layer shown in FIG. 9C through vias filled with black dot. The specific film layer where each via is located, and the specific connection relationship of each via will be described in detail in the subsequent drawing shown in FIG. 10A.

For example, a third insulating layer and a fourth insulating layer (as shown in FIG. 10B and FIG. 10C) are formed on the above-mentioned source-drain electrode metal layer 340 to protect the source-drain electrode metal layer 340 as mentioned above. The second electrode of the light emitting element of each sub-pixel may be on a side of the third insulating layer and the fourth insulating layer away from the base substrate.

Figure 9E:
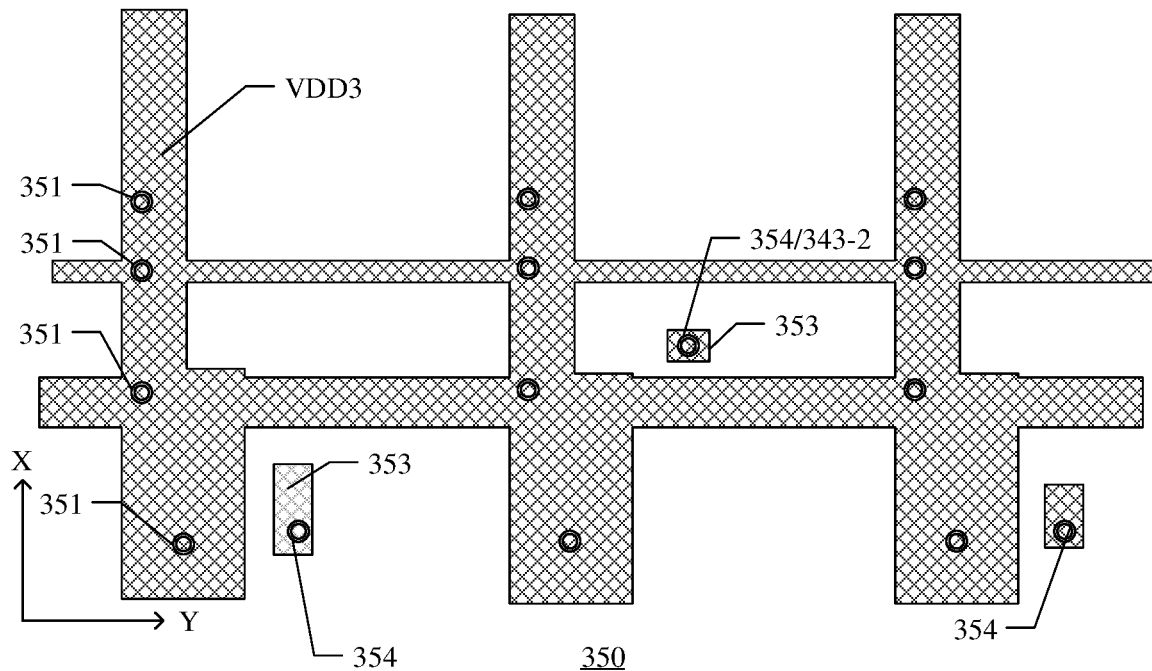

FIG. 9E shows a third conductive layer 350 of the pixel circuit, the third conductive layer 350 comprises a fourth connection portion 353 and a third power signal line VDD3, and the third power signal line VDD3 is distributed crosswise in the X direction and the Y direction. FIG. 9E also shows exemplary locations of a plurality of vias 351 and 354, and the third conductive layer 350 is connected to the source-drain metal layer 340 through the plurality of vias 351 and 354 shown.

Figure 10A:
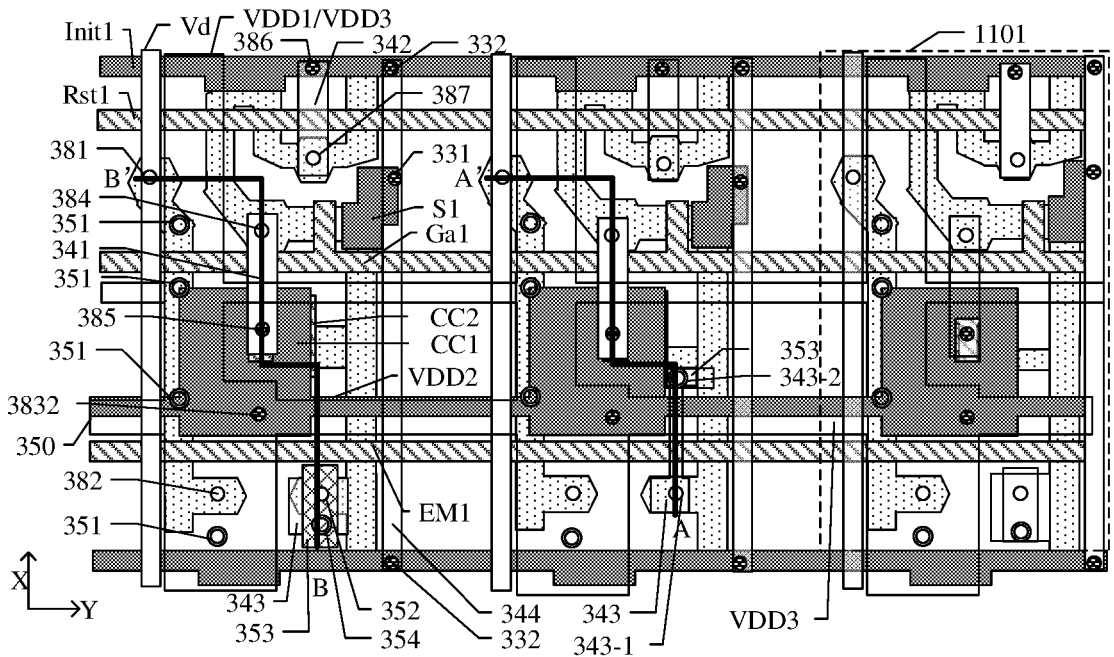
Figure 10B:
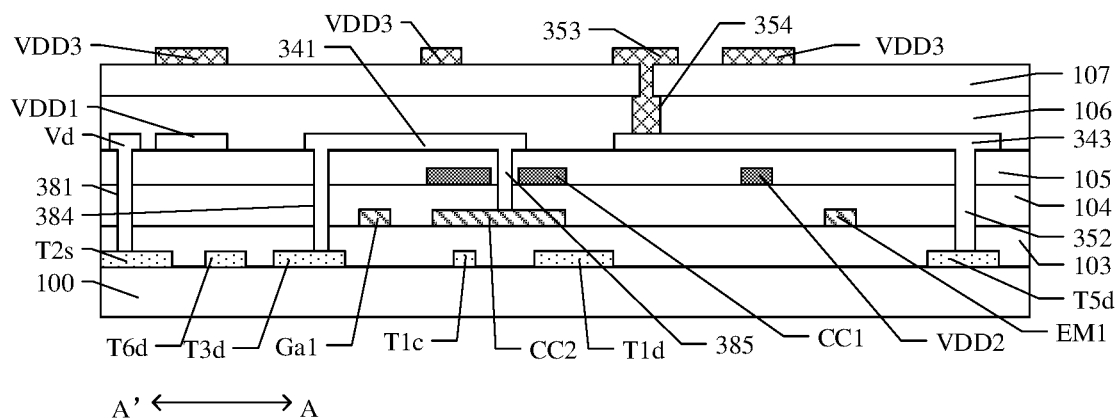
FIG. 10B and FIG. 10C are cross-sectional diagrams taken along a line AA' and a line BB' shown in FIG. 10A.
Figure 10C:
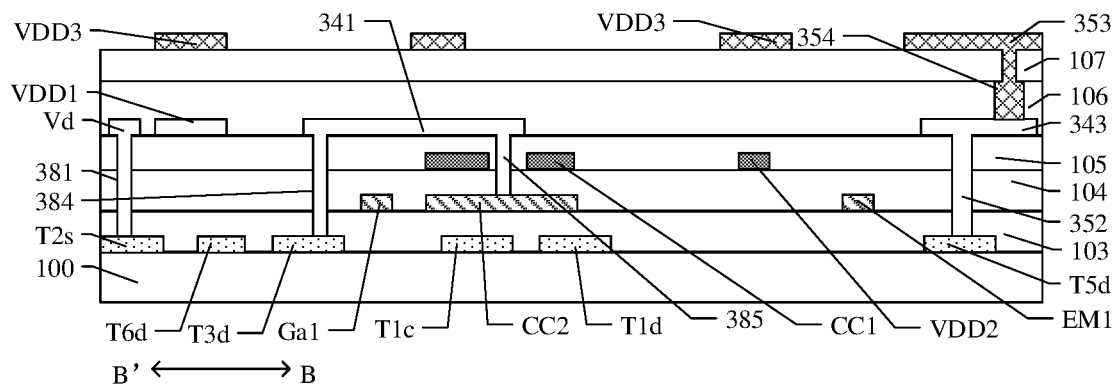

FIG. 10A is a schematic diagram of a stacked positional relationship of the above-mentioned active semiconductor layer 310, the first conductive layer 320, the second conductive layer 330, the source-drain electrode metal layer 340, and the third conductive layer 350. As shown in FIG. 9A-FIG. 10A, the data line Vd is connected to the source region of the data writing transistor T2 in the active semiconductor layer 310 through at least one via (e.g., the via 381) in the gate insulating layer, the first insulating layer, and the second insulating layer. The first power signal line VDD1 is connected to the source region of the second light emitting control transistor T4 in the active semiconductor layer 310 through at least one via (e.g., the via 382) in the gate insulating layer, the first insulating layer, and the second insulating layer.

As shown in FIG. 9A-FIG. 10C, one terminal of the first connection portion 341 is connected to the drain region of the threshold compensation transistor T3 in the active semiconductor layer 310 through at least one via (e.g., the via 384) in the gate insulating layer, the first insulating layer, and the second insulating layer, and the other terminal of the first connection portion 341 is connected to the gate electrode of the driving transistor T1 (i.e., the second electrode CC2 of the storage capacitor C) in the first conductive layer 320 through at least one via (e.g., the via 385) in the first insulating layer and the second insulating layer. One terminal of the second connection portion 342 is connected to the first reset power signal line Init1 through one via (e.g., the via 386) in the second insulating layer, and the other terminal of the second connection portion 342 is connected to the drain region of the second reset transistor T7 in the active semiconductor layer 310 through at least one via (e.g., the via 387) in the gate insulating layer, the first insulating layer, and the second insulating layer. The third connection portion 343 (the connection structure 343) is connected to the drain region of the first light emitting control transistor T5 in the active semiconductor layer 310 through at least one via (e.g., via 352, i.e., the first connection hole 343-1) in an inorganic layer between the connection structure 343 and the active semiconductor layer 310, such as the gate insulating layer 103, the first insulating layer 104 and the second insulating layer 105.

It should be noted that the source region and the drain region of the transistor used in the embodiments of the present disclosure may be the same in structure, so the source region and the drain region may be indistinguishable in structure, and are interchangeable according to needs.

As shown in FIG. 9A-FIG. 10A, the first power signal line VDD1 is connected to the first electrode CC1 of the storage capacitor C through at least one via (e.g., the via 3832) in the second insulating layer between the second conductive layer 330 and the source-drain metal layer 340.

For example, as shown in FIG. 9A-FIG. 10A, the shielding line 344 extends in the X direction, and an orthographic projection of the shielding line 344 on the base substrate is located between an orthographic projection of the driving transistor on the base substrate and an orthographic projection of the data line on the base substrate. For example, the shielding line in the pixel circuit of the first color sub-pixel can reduce the influence of the signal transmitted on the data line in the pixel circuit of the second color sub-pixel on the performance of the threshold compensation transistor T3 of the first color sub-pixel, thereby reducing the influence of the coupling between the gate electrode of the driving transistor of the first color sub-pixel and the data line connecting the second color sub-pixel, and reducing the crosstalk problem.

For example, as shown in FIG. 9A-FIG. 10A, the shielding line 344 is connected to the first reset power signal line Init1 through at least one via in the second insulating layer (e.g., the via 332), in addition to allowing the shielding line to have a fixed potential, it also allow the voltage of the initialization signal transmitted on the first reset power signal line to be more stable, which is more conducive to the working performance of the pixel driving circuit.

For example, as shown in FIG. 9A-FIG. 10A, the shielding line 344 is respectively coupled to two first reset power signal lines Init1 extending in the Y direction, so that the shielding line 344 has a fixed potential, and the two first reset power signal lines Init1 are located on two sides of the shielding line 344 along the X direction. For example, the two first reset power signal lines correspond to the n-th row of pixel circuits and the (n+1)-th row of pixel circuits, respectively.

For example, the shielding line 344 in the same column may be an entire shielding line, and the entire shielding line comprises a plurality of sub-portions between two adjacent first reset power signal lines, and each sub-portion is located within each pixel circuit region in the column.

For example, in addition to coupling the shielding line 344 to the reset power signal line, the shielding line 344 may also be coupled to the first power signal line, so that the shielding line 344 has the same fixed potential as the power signal transmitted by the first power signal line.

For example, the orthographic projection of the shielding line 344 on the base substrate is between the orthographic projection of the threshold compensation transistor T3 on the base substrate and the orthographic projection of the data line Vd on the base substrate, so that the shielding line 344 can reduce the influence of the change of the signal transmitted on the data line on the performance of the threshold compensation transistor T3, thereby reducing the coupling between the gate electrode of the driving transistor and the data signal line Vd(n+1), thereby solving the problem of vertical crosstalk, and making the display substrate have a better display effect while displaying.

For example, the orthographic projection of the shielding line 344 on the base substrate may be located between the orthographic projection of the first connection portion 341 on the base substrate and the orthographic projection of the data line on the base substrate; and the orthographic projection of the shielding line 344 on the base substrate is located between the orthographic projection of the driving transistor T1 on the base substrate and the orthographic projection of the data line on the base substrate.

The above arrangement greatly reduces the first crosstalk generated between the data line and the threshold compensation transistor, and greatly reduces the second crosstalk generated between the data line and the first connection portion, thereby reducing the indirect crosstalk to the driving transistor caused by the first crosstalk and the second crosstalk. In addition, the above arrangement also reduces the direct crosstalk generated between the data line and the driving transistor, thereby better ensuring the working performance of the display substrate.

For example, the shielding line 344 is not limited to the above-mentioned arrangement, and the shielding line 344 may also be coupled only to the reset power signal line corresponding to the n-th row of pixel circuits, or only to the reset power signal line corresponding to the (n+1)-th row of pixel circuits. Moreover, the extending length of the shielding line 344 in the X direction can also be set according to actual needs.

For example, the pixel circuit of sub-pixel of each color further comprises a light shielding portion S1, the light shielding portion S1 is provided in a different layer from the shielding line 344, and an orthographic projection of the shielding portion S1 on the base substrate overlaps with the orthographic projection of the shielding line 344 on the base substrate. The shielding line 344 is connected to the light shielding portion S1 in the second conductive layer 330 through the via 331 in the second insulating layer, so that the light shielding portion S1 has a fixed potential, thereby better reducing coupling effect between the threshold compensation transistor T3 and other conductive patterns nearby, and making the working performance of the display substrate more stable.

For example, the light shielding portion S1 overlaps with the active semiconductor layer 310 between the two gate electrodes of the threshold compensation transistor T3, so as to prevent the active semiconductor layer 310 between the two gate electrodes from being irradiated by light to change characteristics, for example, prevent the voltage of the active semiconductor layer 310 between the two gate electrodes from changing, thereby preventing crosstalk.

The example schematically shows that the light shielding portion is connected to the shielding line, but the embodiments are not limited thereto, and the light shielding portion and the shielding line may not be connected.

For example, as shown in FIG. 9A-FIG. 10A, the third power signal line VDD3 is connected to the first power signal line VDD1 through at least one via 351 in the third insulating layer and the fourth insulating layer, and the fourth connection portion 353 is connected to the third connection portion 343 through the via 354 in the third insulating layer and the fourth insulating layer.

For example, the third insulating layer may be a passivation layer, the fourth insulating layer may be a first planarization layer, and the third insulating layer is located between the fourth insulating layer and the base substrate. The fourth insulating layer may be an organic layer, and the thickness of the organic layer is thicker than that of the inorganic layer such as the passivation layer.

For example, the via 351 and the via 354 are nested vias, that is, the via 351 comprises a first via in the third insulating layer and a second via in the fourth insulating layer, and the position of the first via in the third insulating layer corresponds to the position of the second via in the fourth insulating layer, and the orthographic projection of the second via in the fourth insulating layer on the base substrate is located in the orthographic projection of the first via in the third insulating layer on the base substrate.

For example, the third power signal line VDD3 is distributed in a grid shape, and comprises a portion extending in the X direction and a portion extending in the Y direction. The orthographic projection of the portion of the third power signal line VDD3 extending in the X direction on the base substrate substantially coincides with the orthographic projection of the first power signal line VDD1 on the base substrate, or the orthographic projection the first power signal line VDD1 on the base substrate is located in the orthographic projection of the portion of the third power signal line VDD3 extending in the X direction on the base substrate (FIG. 10A shows the example in which the two orthographic projections substantially coincides with each other), and the third power signal line VDD3 and the first power signal line VDD1 are electrically connected, so as to reduce the voltage drop of the first power signal line VDD1, thereby improving the uniformity of the display device.

For example, the third power signal line VDD3 may adopt the same material as the source-drain metal layer.

In order to clearly illustrate each via, FIG. 10A does not illustrate the positional relationship between the via and each layer.

For example, as shown in FIG. 9A-FIG. 10A, an example of the present disclosure takes a case that relative positional relationships of the components comprised in the pixel circuits in the first color sub-pixel 110 and the third color sub-pixel 130 are the same as an example, for example, a case that the fourth connection portions 353 of the first color sub-pixel 110 and the third color sub-pixel 130 respectively overlap with the drain regions of the second light emitting control transistors T5 comprised in respective sub-pixels is taken as an example. The fourth connection portion 353 in the pixel circuit of the second color sub-pixel 120 (for example, the red sub-pixel) does not overlap with the drain region of the first light emitting control transistor T5, for example, the fourth connection portion 353 of the second color sub-pixel 120 and the drain region of the first light emitting control transistor T5 are located on two sides of the third power signal line VDD3 extending in the Y direction, respectively. For example, as shown in FIG. 9D, the third connection portions 343 of the first color sub-pixel and the third color sub-pixel are both in a block structure, and the third connection portion 343 of the second color sub-pixel is a strip portion extending in the X direction. One end of the strip portion is used to connect to the fourth connection portion 353 to be formed later, and the other end of the strip portion is used to connect to the drain region of the first light emitting control transistor T5, so as to connect the fourth connection portion with the drain region of the first light emitting control transistor T5. Then, the anode of sub-pixel of each color formed later will be connected to the corresponding fourth connection portion 353 through a via to realize connection between the anode and the drain region of the first light emitting control transistor T5.

The embodiment comprises but is not limited thereto. The position of the fourth connection portion in sub-pixel of each color is determined according to the arrangement rule of the organic light emitting elements and the position of the light emitting region.

FIG. 10B is a partial cross-sectional structure diagram taken along the line AA' shown in FIG. 10A. As shown in FIG. 10A-FIG. 10B, the gate insulating layer 103 is provided on a side of the second electrode (for example, the drain electrode T5d) of the first light emitting control transistor T5 in the active semiconductor layer in the pixel circuit of the second color sub-pixel 120 away from the base substrate 100. The first light emitting control signal line EM1 is provided on a side of the gate insulating layer 103 away from the base substrate 100, the first insulating layer 104 is provided on a side of the first light emitting control signal line EM1 away from the base substrate 100, the second power signal line VDD2 is provided on a side of the first insulating layer 104 away from the base substrate 100, the second insulating layer 105 is provided on a side of the second power signal line VDD2 away from the base substrate 100, and the third connection portion 343 is provided on a side of the second insulating layer 105 away from the base substrate 100. The third connection portion 343 of the second color sub-pixel 120 is connected to the second electrode T5d of the first light emitting control transistor T5 in the active semiconductor layer 310 through the via 352 in the gate insulating layer 103, the first insulating layer 104, and the second insulating layer 105. The third connection portion 343 overlaps with the second power signal line VDD2 and the first light emitting control signal line EM1. The third insulating layer 106 and the fourth insulating layer 107 are provided in sequence on a side of the third connection portion 343 away from the base substrate 100, and the fourth connection portion 353 and the third power signal line VDD3 are provided on a side of the fourth insulating layer 107 away from the base substrate 100. The third power signal line VDD3 overlaps with the second power signal line VDD2. The fourth connection portion 353 is connected to the third connection portion 343 through the nested via 354 in the third insulating layer 106 and the fourth insulating layer 107, and thus is connected to the second light emitting control transistor.

For example, as shown in FIG. 10B, the data line Vd is connected to the source electrode T2s of the data writing transistor T2 through the via 381 in the gate insulating layer 103, the first insulating layer 104, and the second insulating layer 105; one end of the first connection portion 341 is connected to the drain electrode T3d of the threshold compensation transistor T3 through the via 384 in the gate insulating layer 103, the first insulating layer 104, and the second insulating layer 105, and the other end of the first connection portion 341 is connected to the gate electrode of the driving transistor T1 (that is, the second electrode CC2 of the storage capacitor C) through the via 385 in the first insulating layer 104 and the second insulating layer 105; the channel T1c of the driving transistor T1 is located on a side of the gate electrode facing the base substrate 100, and the channel T1c does not overlap with the via 385, the source electrode T1d of the driving transistor T1 overlaps with the gate electrode of the driving transistor T1 and the first electrode CC1 of the storage capacitor C.

FIG. 10C is a partial cross-sectional structure diagram taken along the line B-B' shown in FIG. 10A. As shown in FIG. 10A-FIG. 10C, The first color sub-pixel 110 is different from the second color sub-pixel 120 in that the orthographic projection of the fourth connection portion 353 in the second color sub-pixel 120 on the base substrate 100 does not overlap with the orthographic projection of the second electrode T5d of the first light emitting control transistor T5 of the second color sub-pixel 120 on the base substrate 100, and the orthographic projection of the fourth connection portion 353 of the first color sub-pixel 130 on the base substrate 100 overlaps with the orthographic projection of the second electrode T5d of the first light emitting control transistor T5 of the first color sub-pixel 130 on the base substrate 100. In the first color sub-pixel 110, the third connection portion 343 does not overlap with the second power signal line VDD2 and the first light emitting control signal line EM1. In the first color sub-pixel 110, the channel T1c of the driving transistor T1 is located on a side of the gate electrode of the driving transistor T1 facing the base substrate 100, and the channel T1c of the driving transistor T1 overlaps with the via 385. It can be seen that the channel width of the driving transistor in the first color sub-pixel is greater than the channel width of the driving transistor in the second color sub-pixel.

For example, as shown in FIG. 9A-FIG. 10A, in the second direction X, the first scanning signal line Ga1, the first reset control signal line Rst1, and the first reset power signal line Init1 are all located on the first side of the gate electrode of the driving transistor T1 in the pixel circuit of the first color sub-pixel, and the first light emitting control signal line EM1 is located on the second side of the driving transistor T1 in the pixel circuit of the first color sub-pixel.

For example, the first scanning signal line Ga1, the first reset control signal line Rst1, the first light emitting control signal line EM1, and the first reset power signal line Init1 all extend in the first direction Y, and the data line Vd extends in the second direction X.

For example, the first power signal line VDD1 extends in the second direction X, and the second power signal line VDD2 extends in the first direction Y. Signal lines connecting the first power supply terminal VDD are routed in grid on the display substrate. In other words, on the entire display substrate, the first power signal line VDD1 and the second power signal line VDD2 are disposed in grid, so that the resistance of the signal lines connecting the first power supply terminal VDD is small, and the voltage drop is low, thereby improving the stability of the power supply voltage provided by the first power supply terminal VDD.

It should be noted that the positional arrangement of the driving circuit, the first light emitting control circuit, the second light emitting control circuit, the data writing circuit, the storage circuit, the threshold compensation circuit, and the reset circuit in each pixel circuit is not limited to the example shown in FIG. 9A-FIG. 10A, according to actual application requirements, the position arrangement of the driving circuit, the first light emitting control circuit, the second light emitting control circuit, the data writing circuit, the storage circuit, the threshold compensation circuit, and the reset circuit can be specifically provided.

Figure 11A:
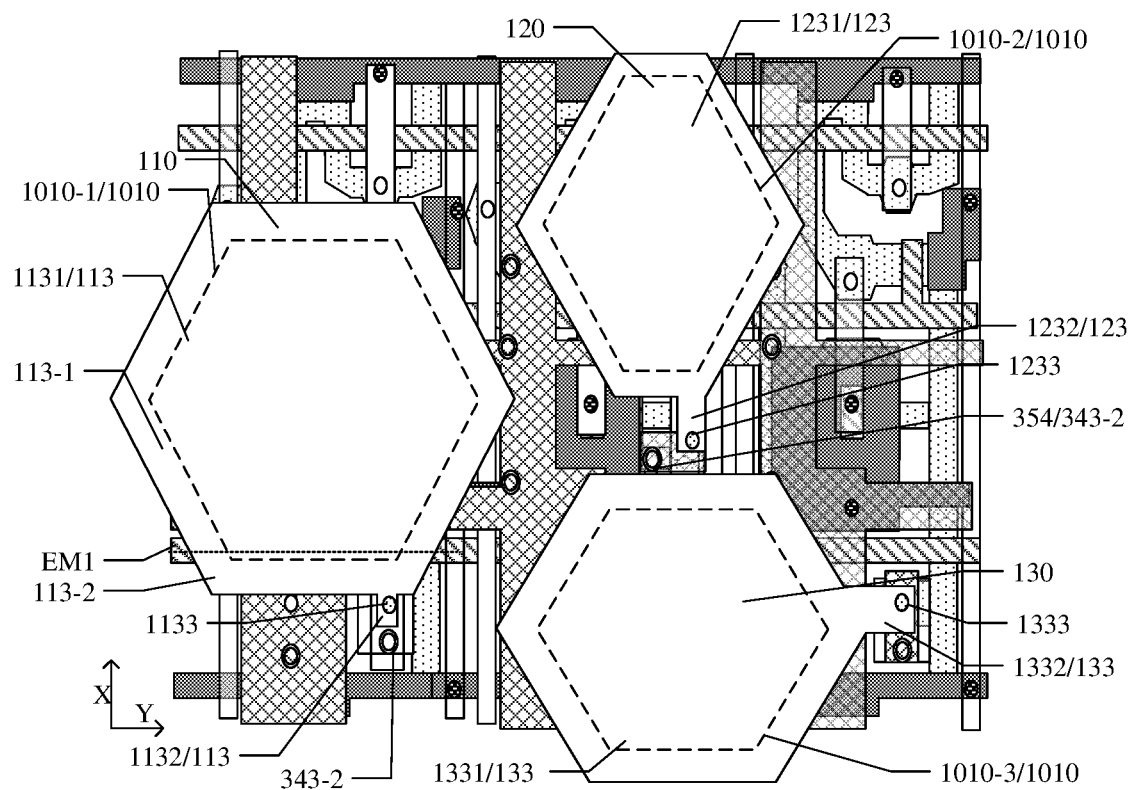
FIG. 11A is a partial structural diagram of an array substrate provided by an example of an embodiment of the present disclosure.

FIG. 11A is a partial structural diagram of an array substrate provided by an example of the embodiment. As shown in FIG. 11A, the pixel circuit comprised in sub-pixel of each color in the array substrate of the example is the pixel circuit shown in FIG. 10A. For example, as shown in FIG. 9A-FIG. 11A, a fifth insulating layer (not shown) is provided on a side of the third power signal line VDD3 away from the first power signal line VDD1. For example, the fifth insulating layer may be a second planarization layer, and the material of the fifth insulating layer may be the same as the material of the fourth insulating layer (that is, the first planarization layer), such as an organic material.

For example, as illustrated in FIG. 9A-FIG. 11B, in at least one pixel unit, a first electrode of the first light emitting control transistor T5 of the second color sub-pixel 120 is electrically connected with the connection structure 343 through the first connection hole 343-1, and the connection structure 343 is electrically connected with the second electrode 123 of the second color sub-pixel 120 through the second connection hole 343-2 (i.e., the via 352), an orthographic projection of at least part of the first connection hole 343-1 on the base substrate 100 is located on a side of an orthographic projection of the light emitting control signal line EM1 on the base substrate, and an orthographic projection of at least part of the second connection hole 343-2 on the base substrate 100 is located on the other side of the orthographic projection of the light emitting control signal line EM1 on the base substrate 100; in at least one pixel unit, the second electrode 133 of the third color sub-pixel 130 does not overlap with the channel T1c of the driving transistor T1 controlling the organic light emitting element of the third color sub-pixel 130 in the third direction perpendicular to the base substrate 100.

The present disclosure provides a pixel arrangement structure, which can effectively drive the second color sub-pixel to emit light by the connection structure on the basis of improving the compactness of the pixel arrangement to improve the pixel resolution by setting a positional relationship between the two connection holes and the light emitting control signal line and a positional relationship between the second electrode of the third color sub-pixel and the channel of the driving transistor of the third color sub-pixel.

In the present disclosure, data lines and power lines are disposed in different layers, namely double-layer signal lines, so as to realize the compact arrangement of pixels and the optimized wiring mode.

Figure 11B:
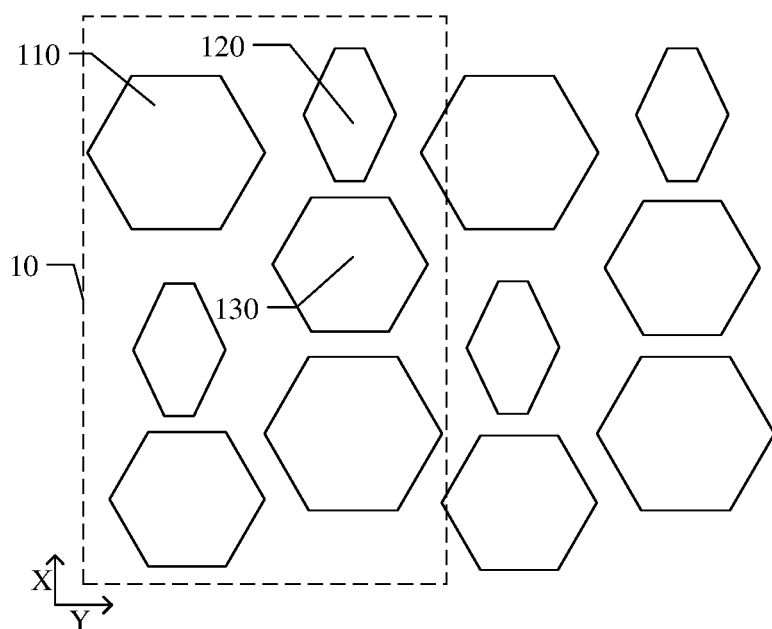
FIG. 11B is a schematic diagram of an arrangement structure of pixels shown in FIG. 11A.

For example, as shown in FIG. 11A and FIG. 11B, the second electrode of the second color sub-pixel 120 and the second electrode of the third color sub-pixel 130 are alternately arranged along the second direction. For example, the second electrode of the third color sub-pixel overlaps with the pixel circuit of the second color sub-pixel in the direction perpendicular to the substrate. In the present disclosure, by setting the second electrode of the third color sub-pixel to overlap with the pixel circuit of the second color sub-pixel, the compactness of pixel arrangement can be effectively improved.

For example, a center of the orthographic projection of the first connection hole 343-1 on the base substrate 100 is located on a side of the orthographic projection of the light emitting control signal line EM1 on the base substrate 100, and a center of the orthographic projection of the second connection hole 343-2 on the base substrate 100 is located on the other side of the orthographic projection of the light emitting control signal line EM1 on the base substrate 100.

For example, as shown in FIG. 9A-FIG. 11B, in the second color sub-pixel 120, the connection structure 343 is electrically connected with the second electrode 123 through the second connection hole 343-2 located in at least one of the inorganic layer and the organic layer between the connection structure 343 and the second electrode 123. For example, the insulating layer 106 may be an inorganic layer, and the insulating layer 107 may be an organic layer 107, but is not limited thereto. The inorganic layer has the functions of electrical insulation, water and oxygen isolation, and the organic layer has the function of ensuring the flatness of the anode. For example, the second connection hole 343-2 is a through hole 354 in the fourth insulating layer 107. The first connecting hole and the second connecting hole are holes directly connected with the connection structure. For example, the connection structure is electrically connected with the second electrode through the second connection hole, and the connection structure and the second electrode may also include though holes in other film layers for transferring. For example, the connection structure 343 is connected with the fourth connection portion 353 through the second connecting hole 343-2 in the third insulating layer 106 and the fourth insulating layer 107, and the fourth connection portion 353 is connected with the second electrode through a transferring hole in the fifth insulating layer, thereby realizing the electrical connection between the connection structure and the second electrode.

For example, as shown in FIG. 10A, FIG. 10B and FIG. 11A, in at least one second color sub-pixel 120, the orthographic projection of the first connection hole 343-1 (i.e., 352) on the base substrate 100 has a first area, and the orthographic projection of the second connection hole 343-2 (i.e., 354) on the base substrate 100 has a second area, which is different from the first area.

For example, as shown in FIG. 10A, FIG. 10B and FIG. 11A, in at least one second color sub-pixel 120, the first connection hole 343-1 has a first distance from the light emitting control signal line EM1 in the second direction, and the second connection hole 343-2 has a second distance from the light emitting control signal line EM2 in the second direction, and the first distance and the second distance are different. Here, the distance from the connection hole to the light emitting control signal line may refer to the distance between the edges of the connection hole and the light emitting control signal line close to each other, but is not limited to this, and may also be the distance between the center of the connection hole and the center line of the light emitting control signal line.

For example, as shown in FIG. 9A-FIG. 11B, the second electrode 113 (that is, the anode) of the organic light emitting element of the first color sub-pixel 110 is connected to the fourth connection portion 353 through a via 1133 (not shown) in the fifth insulating layer, and thus the second electrode is connected to the drain region of the first light emitting control transistor T5. Similarly, the second electrode 133 (that is, the anode) of the organic light emitting element of the third color sub-pixel 130 is connected to the fourth connection portion 353 through a via 1133 (not shown) in the fifth insulating layer, and thus the second electrode is connected to the drain region of the first light emitting control transistor T5. The second electrode 123 (that is, the anode) of the organic light emitting element of the second color sub-pixel 120 is connected to the fourth connection portion 353 through a via in the fifth insulating layer, and thus the second electrode is connected to the third connection portion 343 to realize the connection between the second electrode and the drain region of the first light emitting control transistor T5.

For example, as shown in FIG. 9A-FIG. 11B, in at least one pixel unit, the second electrode 133 of the third color sub-pixel 130 does not overlap with the channels of the driving transistors T1 controlling the organic light emitting elements of other color sub-pixels (such as the first color sub-pixel 110 and the second color sub-pixel 120) in the third direction.

For example, as shown in FIG. 9A-FIG. 11B, in at least one pixel unit, the orthographic projection of the first connection hole 343-1 of the second color sub-pixel 120 on the base substrate 100 is farther away from an orthographic projection of the second electrode 123 of the second color sub-pixel 120 on the base substrate 100 compared with the orthographic projection of the second connection hole 343-2 of the second color sub-pixel 120 on the base substrate 100. In the embodiment of the present disclosure, both the first connection hole and the second connection hole in the second color sub-pixel are far away from the light emitting area of the second color sub-pixel, so even if the second connection hole is close to the region where the second electrode overlaps with the light emitting layer, it will not affect the flatness of the light emitting layer and the second electrode in the light emitting region.

For example, as shown in FIG. 9A-FIG. 11B, in at least one pixel unit, the second electrode 123 of the second color sub-pixel 120 overlaps the channel of the driving transistor T1 driving the organic light emitting element of the second color sub-pixel 120 in the third direction, so that the compact arrangement of the pixels can be realized and the resolution of pixels can be improved.

For example, as shown in FIG. 9A-FIG. 11B, in at least one pixel unit, the data line Vd connected with the pixel circuit of the second color sub-pixel 120 and the second electrode 123 of the second color sub-pixel 120 are spaced apart from each other in the first direction (i.e., the y direction). The orthographic projection of the data line Vd connected to the pixel circuit of the second color sub-pixel 120 on the base substrate 100 does not overlap with the orthographic projection of the second electrode 123 of the second color sub-pixel 120 on the base substrate 100.

For example, as shown in FIG. 9A-FIG. 11B, the second electrode 123 of the second color sub-pixel 120 and the data line Vd connected to the pixel circuit of the third color sub-pixel 130 overlap in the third direction.

For example, as shown in FIG. 9A-FIG. 11B, in at least one pixel unit, an orthographic projection of the second electrode 113 of the first color sub-pixel 110 and an orthographic projection of the second electrode 133 of the third color sub-pixel 130 on a first straight line extending along the second direction overlaps with an orthographic projection of the connection structure 343 of the second color sub-pixel 120 on the first straight line.

For example, as shown in FIG. 9A-FIG. 11B, in at least one pixel unit, an orthographic projection of the second electrode 133 of the third color sub-pixel 130 on a second straight line extending along the first direction overlaps with an orthographic projection of the connection structure 343 of the second color sub-pixel 120 on the second straight line.

For example, as shown in FIG. 11A, the second electrode of the organic light emitting element of sub-pixel of each color comprises a main electrode and a connection electrode, and the main electrode of sub-pixel of each color has a shape of a hexagon.

For example, as shown in FIG. 11A, the second electrode 113 of the first color sub-pixel 110 comprises a first main electrode 1131 and a first connection electrode 1132. The first main electrode 1131 and the first connection electrode 1132 may be an integral structure, the first connection electrode 1132 is connected to the fourth connection portion 353 through a connection hole 1133, and thus the first connection electrode is connected to the third connection portion 343 to realize connection between the first connection electrode and the second electrode of the first light emitting control transistor T5 of the first color sub-pixel 110. The second electrode 123 of the second color sub-pixel 120 comprises a second main electrode 1231 and a second connection electrode 1232. The second main electrode 1231 and the second connection electrode 1232 may be an integrated structure, and the second connection electrode 1232 is connected to the fourth connection portion 353 through a connection hole 1233, and thus the second connection electrode is connected to the third connection portion 343 to realize connection between the second connection electrode and the second electrode of the first light emitting control transistor T5 of the second color sub-pixel 120. The second electrode 133 of the third color sub-pixel 130 comprises a third main electrode 1331 and a third connection electrode 1332. The third main electrode 1331 and the third connection electrode 1332 may be an integrated structure, and the third connection electrode 1332 is connected to the fourth connection portion 353 through a connection hole 1333, and thus the third connection electrode is connected to the third connection portion 343 to realize connection between the third connection electrode and the second electrode of the first light emitting control transistor T5 of the third color sub-pixel 130.

For example, as shown in FIG. 9A-FIG. 11B, an orthographic projection of the main electrode 1131 of the first color sub-pixel 110 on the first straight line overlaps with an orthographic projection of the connection structure 343 of the second color sub-pixel 120 on the first straight line.

For example, as shown in FIG. 9A-FIG. 11B, the orthographic projection of the main electrode 1331 of the third color sub-pixel 130 on the second straight line overlaps with the orthographic projection of the connection structure 343 of the second color sub-pixel 120 on the second straight line.

For example, as shown in FIG. 9A-FIG. 11B, the second electrode 123 of the second color sub-pixel 120 overlaps with the scanning signal line Ga1 in the third direction. The orthographic projection of the second electrode 123 of the second color sub-pixel 120 on the base substrate 100 overlaps with the orthographic projection of the scanning signal line Ga1 on the base substrate 100.

For example, as shown in FIG. 9A-FIG. 11B, the second electrode 123 of the second color sub-pixel 120 overlaps with the scanning signal line Ga1 electrically connected with the pixel circuit of the second color sub-pixel 120 in the third direction. For example, the orthographic projection of the second electrode 123 of the second color sub-pixel 120 on the base substrate 100 overlaps with the orthographic projection of the scanning signal line Ga1 electrically connected with the pixel circuit of the second color sub-pixel 120 on the base substrate 100.

For example, as shown in FIG. 9A-FIG. 11B, in at least one pixel unit, the second electrode 113 of the first color sub-pixel 110 and the second electrode 133 of the third color sub-pixel 130 both overlap with the light emitting control signal line EM1 in the third direction. For example, in at least one pixel unit, the orthographic projection of the second electrode 113 of the first color sub-pixel 110 and the orthographic projection of the second electrode 133 of the third color sub-pixel 130 on the base substrate 100 both overlap with the orthographic projection of the light emitting control signal line EM1 on the base substrate 100.

For example, as shown in FIG. 9A-FIG. 11B, the second electrode 113 of the first color sub-pixel 110 includes a first electrode sub-part 113-1 and a second electrode sub-part 113-2 located on both sides of the light emitting control signal line EM1 respectively, and the area of the first electrode sub-part 113-1 is greater than that of the second electrode sub-part 113-2. Referring to the center line of the light emitting control signal line as shown in FIG. 11A, the parts of the second electrode 113 of the first color sub-pixel 110 located on both sides of the center line of the light emitting control signal line are the first electrode sub-part 113-1 and the second electrode sub-part 113-2, respectively.

For example, as shown in FIG. 9A-FIG. 11B, in the first color sub-pixel 110, the center of the orthographic projection of the second connection hole 343-2 on the base substrate 100 and the orthographic projection of the first electrode sub-part 113-1 on the base substrate 100 are respectively located on both sides of the orthographic projection of the light emitting control signal line EM1 on the base substrate 100.

For example, as shown in FIG. 9A-FIG. 11B, in at least one pixel unit, the second electrode CC2 of the storage capacitor C is multiplexed as the gate electrode of the driving transistor T1, and the area of the second electrode CC2 of the storage capacitor C of the first color sub-pixel 110 is different from that of the second electrode CC2 of the storage capacitor C of the second color sub-pixel 120.

For example, as shown in FIG. 9A-FIG. 11B, the area of the second electrode 113 of the first color sub-pixel 110 is greater than that of the second electrode 123 of the second color sub-pixel 120, and the area of the second electrode CC2 of the storage capacitor C of the first color sub-pixel 110 is greater than that of the second electrode CC2 of the storage capacitor C of the second color sub-pixel 120.

For example, as shown in FIG. 9A-FIG. 11B, in the second color sub-pixel 120, the first electrode CC1 of the storage capacitor C overlaps with the connection structure 343 in the third direction.

For example, as shown in FIG. 9A-FIG. 11B, the second electrode 113 of the first color sub-pixel 110 overlaps with the data line Vd in the third direction, and a length of the overlapped portion of the second electrode and the data line in the second direction is greater than 80% of a maximum length of the second electrode 113 in the second direction, thereby improving the flatness of the second electrode of the first color sub-pixel. For example, the orthographic projection of the second electrode 113 of the first color sub-pixel 110 on the base substrate 100 overlaps with the orthographic projection of the data line Vd on the base substrate 100, and the length of the overlapped portion of the second electrode and the data line in the second direction is greater than 80% of the maximum length of the orthographic projection of the second electrode 113 in the second direction.

For example, as shown in FIG. 9A-FIG. 11B, the second electrode 113 of the first color sub-pixel 110 overlaps with the power line VDD3 in the third direction, and the length of the overlapped portion of the second electrode and the power line in the second direction is greater than 80% of a maximum length of the second electrode 113 in the second direction, thereby improving the flatness of the second electrode of the first color sub-pixel. For example, the orthographic projection of the second electrode 113 of the first color sub-pixel 110 on the substrate 100 overlaps with the orthographic projection of the power line VDD3 on the substrate 100, and the length of the overlapped portion of the second electrode and the power line in the second direction is greater than 80% of the maximum length of the orthographic projection of the second electrode 113 in the second direction.

For example, the first connection electrode 1132 of the first color sub-pixel 110 is located on a side of a center of the first main electrode 1131 away from the data line connecting the pixel circuit of the first color sub-pixel in the Y direction, and is located on a side of the center of the first main electrode 1131 away from the light emitting control signal line connecting the pixel circuit of the first color sub-pixel in the X direction. For example, the first connection electrode 1132 and the first main electrode 1131 of the first color sub-pixel 110 are disposed in the X direction, and the first connection electrode 1132 is located on a lower right corner of the first main electrode 1131. For example, the second connection electrode 1232 of the second color sub-pixel 120 is located on a side of a center of the second main electrode 1231 away from the data line connecting the pixel circuit of the second color sub-pixel in the Y direction, and is located on a side of the center of the second main electrode 1231 close to light emitting control signal line of the second color pixel circuit of the sub-pixel in the X direction. For example, the second connection electrode 1232 and the second main electrode 1231 of the second color sub-pixel 120 are disposed in the X direction, and the second connection electrode 1232 is located on a lower right corner of the second main electrode 1231. For example, the third connection electrode 1332 and the third main electrode 1331 of the third color sub-pixel 130 are disposed in the Y direction, and the third connection electrode 1332 is located on the right side of the third main electrode 1331, that is, the third connection electrode 1332 is on a side of the center of the third main electrode close to the shielding line connecting the pixel circuit of the sub-pixel.

For example, as shown in FIG. 9A-FIG. 11B, a pixel defining layer (such as the pixel defining layer 101 shown in FIG. 1B) is further provided between adjacent sub-pixels. The pixel defining layer comprises openings for defining light emitting regions of sub-pixels with different colors. An orthographic projection of an edge of one opening of the pixel defining layer on the base substrate is in an orthographic projection of the main electrode of a corresponding second electrode on the base substrate.

For example, as illustrated in FIG. 1B, FIG. 9A-FIG. 11B, the display device further includes a pixel defining layer 101 located at a side of the second electrode of each sub-pixel away from the base substrate 100, the pixel defining layer 101 includes an opening 1010 for defining a light emitting region of each sub-pixel, at least part of the organic light emitting layer of each sub-pixel is located in the opening 1010, and an orthographic projection of the opening 1010 of the pixel defining layer 101 on the base substrate 100 is located in an orthographic projection of the main electrode of the second electrode of each sub-pixel on the base substrate 100. In the pixel defining layer 101, an area of an opening 1010-3 defining a light emitting region of each third color sub-pixel 130 is greater than an area of an opening 1010-2 defining a light emitting region of each second color sub-pixel 120 and smaller than an area of an opening 1010-1 defining a light emitting region of each first color sub-pixel 110.

For example, sub-pixel of each color further comprises an organic light emitting layer (such as the organic light emitting layer 112 or 122 shown in FIG. 1B), and the organic light emitting layer is located on a side of the second electrode away from the base substrate. The second electrode of sub-pixel of each color is in contact with the organic light emitting layer at the opening of the pixel defining layer, and the opening of the pixel defining layer defines the shape of the light emitting region of the sub-pixel. For example, the second electrode (that is, the anode) of the organic light emitting element may be disposed under the pixel defining layer, and the pixel defining layer comprises the opening for defining a sub-pixel, the opening exposes a part of the second electrode, in a case where the organic light emitting layer is formed in the opening of the pixel defining layer, the organic light emitting layer is in contact with the second electrode, and this part can drive the organic light emitting layer to emit light.

For example, the orthographic projection of the opening of the pixel defining layer on the base substrate is in the orthographic projection of the corresponding organic light emitting layer on the base substrate, that is, the organic light emitting layer covers the opening of the pixel defining layer. For example, the area of the organic light emitting layer is larger than the area of the corresponding opening of the pixel defining layer, that is, the organic light emitting layer comprises at least a portion covering the physical structure of the pixel defining layer in addition to the portion in the opening of the pixel defining layer, and generally, the organic light emitting layer covers the physical structure of the pixel defining layer at each boundary of the opening of the pixel defining layer. It should be noted that the above description of the organic light emitting layer pattern is based on, for example, the patterned organic light emitting layer of each sub-pixel formed by the FMM process. In addition to the FMM manufacturing process, some organic light emitting layers may be an integral film layer formed by the open mask process on the entire display region, and the orthographic projection of the shape of the integral film layer on the base substrate is continuous, so there must be a portion located in the opening of the pixel defining layer and a portion located on the physical structure of the pixel defining layer.

Another embodiment of the present disclosure provides a display device, which includes the display substrate illustrated in FIG. 9A-FIG. 11B.

As shown in FIG. 11A, the second electrode of the organic light emitting element of sub-pixel of each color has the shape of a hexagon. The plurality of sub-pixels may be divided into a plurality of pixel unit groups 10 disposed in an array in the X direction and the Y direction. Each pixel unit group 10 comprises two columns of sub-pixels disposed along the Y direction, and each column of sub-pixels comprises a first color sub-pixel 110, a second color sub-pixel 120, and a third color sub-pixel 130. Along the X direction, the two columns of sub-pixels in each pixel unit group 10 are shifted from each other by a distance less than one sub-pixel pitch, for example, the two columns of sub-pixels in each pixel unit group 10 are shifted from each other by about half the pitch of a sub-pixel. For example, the sides of two adjacent sub-pixels facing each other are substantially parallel. For example, the arrangement order of the first color sub-pixel, the second color sub-pixel, and the third color sub-pixel in the adjacent column is the same. For example, in the X (column) direction, for example, the first color sub-pixel is located between the second color sub-pixel and the third color sub-pixel that are in a column adjacent to a column of the first color sub-pixel, and the second color sub-pixel is located between the first color sub-pixel and the third color sub-pixel that are in a column adjacent to a column of the second color sub-pixel, and the third color sub-pixel is located between the first color sub-pixel and the second color sub-pixel that are in a column adjacent to a column of the third color sub-pixel.

For example, in one pixel unit group 10, one first color sub-pixel in the first column and one second color sub-pixel and one third color sub-pixel in the second column that are adjacent to the one first color sub-pixel in the first column constitute one pixel unit, which can realize one pixel display. In one pixel unit group 10, among two adjacent pixel units, the first column of sub-pixels and the second column of sub-pixels in the first pixel unit are swapped with the first column and the second column in the second pixel unit, for example, the first color sub-pixel in the first pixel unit is located in the first column, the second color sub-pixel and the third color sub-pixel in the first pixel unit are located in the second column, and the first color sub-pixel in the second pixel unit is located in the second column, and the second color sub-pixel and the third color sub-pixel in the second pixel unit are located in the first column. For example, the first color sub-pixel is a blue sub-pixel, the second color sub-pixel is a red sub-pixel, and the third color sub-pixel is a green sub-pixel. Each pixel unit comprises one blue sub-pixel in one column and one red sub-pixel and one green sub-pixel in the adjacent column that are adjacent to the blue sub-pixel.

For example, the area of the light emitting region of one blue sub-pixel is larger than the area of the light emitting region of one red sub-pixel or the area of the light emitting region of one green sub-pixel. For example, the area of the anode of one blue sub-pixel is larger than the area of the anode of one red sub-pixel or the area of the anode of one green sub-pixel. For example, the main electrode of the anode of the first color sub-pixel and the shape of the main electrode of the anode of the third color sub-pixel have a shape of a roughly regular hexagon, and the shape of the main electrode of the anode of the second color sub-pixel is non-regular hexagon shape and comprises two symmetry axes, and a size of the symmetry axis in the X direction is larger than a size of the symmetry axis in the Y direction.

For example, as shown in FIG. 11A, the first main electrode 1131 of the second electrode 113 of the first color sub-pixel 110 covers the driving transistor of the first color sub-pixel 110, the second main electrode 1231 of the second electrode 123 of the second color sub-pixel 120 substantially does not overlap or partially overlap with the driving transistor of the second color sub-pixel 120, and the third main electrode 1331 of the second electrode 133 of the third color sub-pixel 130 does not overlap with the driving transistor of the third color sub-pixel 130.

For example, as shown in FIG. 11A, the first main electrode 1131 of the first color sub-pixel 110 (e.g., the blue sub-pixel) overlaps with the scanning line and the light emitting control signal line; the second main electrode 1231 of the second color sub-pixel 120 (e.g., the red sub-pixel) overlaps with the scanning line and the reset control signal line; and the third main electrode 1331 of the third color sub-pixel 130 (e.g., the green sub-pixel) overlaps with the light emitting control signal line, the reset control signal line connecting the next row of pixel circuits and the reset power signal line connecting the next row of the pixel circuits. For example, the third main electrode 1331 of the third color sub-pixel 130 (e.g., the green sub-pixel) overlaps with a region of the pixel circuit of the first color sub-pixel (e.g., the blue sub-pixel), in the next row, adjacent to the third color sub-pixel 130.

For example, the first main electrode 1131 of the first color sub-pixel 110 overlaps with a portion of the driving transistor of the third color sub-pixel 130 adjacent to the first color sub-pixel, and the first main electrode 1131 of the first color sub-pixel 110 overlaps with the data line and the shielding line connecting the pixel circuit of the first color sub-pixel 110, and the data line connecting the pixel circuit of the second color sub-pixels 120 adjacent to the first color sub-pixel. The second main electrode 1231 of the second color sub-pixel 120 does not overlap with the data line connecting the pixel circuit of the second color sub-pixel 120, and overlaps with the first power signal line connecting the pixel circuit of the second color sub-pixel 120, the first power signal line and the data line connecting the pixel circuit of the third color sub-pixel 130 adjacent to the second color sub-pixel. The third main electrode 1331 of the third color sub-pixel 130 overlaps with the data line and the first power signal line connecting the pixel circuit of the third color sub-pixel 130, and the first power signal line connecting the pixel circuit of the second color sub-pixel 120 adjacent to the third color sub-pixel.

For example, as shown in FIG. 11A, a side of the first main electrode 1131 of the first color sub-pixel 110 close to the reset control signal line connecting the sub-pixels in the next row is provided with the first connection electrode 1132 connected to the first main electrode 1131; a side of the second main electrode 1231 of the second color sub-pixel 120 close to the reset control signal line connecting the sub-pixels in the next row is provided with the second connection electrode 1232 connected to the second main electrode 1231; and a side of the third main electrode 1331 of the third color sub-pixel 130 close to the second light emitting control transistor of the third color sub-pixel 130 is provided with the third connection electrode 1332 connected to the third main electrode 1331.

For example, as shown in FIG. 11A, the first connection electrode 1132 of the first color sub-pixel 110 overlaps with the second electrode of the second light emitting control transistor in the pixel circuit of the first color sub-pixel 110. The second connection electrode 1232 of the second color sub-pixel 120 does not overlap with the second electrode of the second light emitting control transistor in the pixel circuit of the second color sub-pixel 120, and the second electrode of the second light emitting control transistor of the second color sub-pixel 120 overlaps with the third main electrode 1331 of the third color sub-pixel 130. The third connection electrode 1332 of the third color sub-pixel 130 overlaps with the second electrode of the second light emitting control transistor in the pixel circuit of the third color sub-pixel 130.

Figure 12:
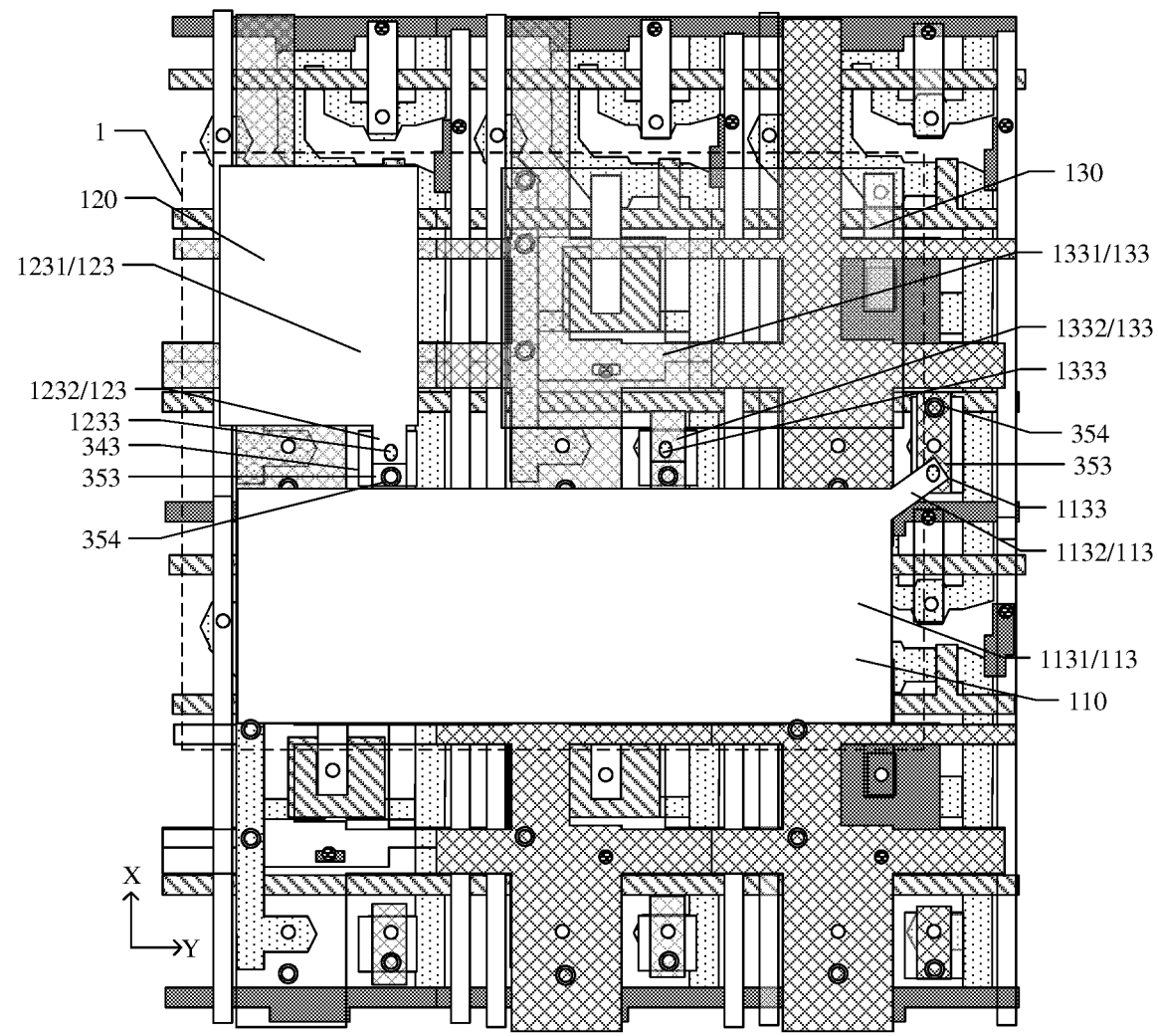
FIG. 12 is a partial structural diagram of an array substrate provided by another example of an embodiment.

FIG. 12 is a partial structural diagram of an array substrate provided by another example of the embodiment. As shown in FIG. 12, the pixel circuit comprised in sub-pixel of each color in the array substrate in this example is different from the pixel circuit shown in FIG. 10 in that the shapes of the third connection portion in the pixel circuit of the second color sub-pixel 120 and the third connection portion of the third color sub-pixel are the same in this example, and relative positional relationships of the third connection portion in the pixel circuit of the second color sub-pixel 120 and the third connection portion of the third color sub-pixel are the same in the example. In addition, in the second color sub-pixel 120 and the third color sub-pixel 130, the fourth connection portion 353 in the pixel circuit is connected to the third connection portion 343 through the connection via 354, and the connection via 354 is located on a side of the second electrode of the first light emitting control transistor T5 away from the first light emitting control signal line EM1. In the first color sub-pixel 110, the fourth connection portion 353 in the pixel circuit is connected to the third connection portion 343 through the connection via 354, and the connection via 354 is located on a side of the second electrode of the first light emitting control transistor T5 close to the first light emitting control signal line EM1. For example, the connection via 354 overlaps with the first light emitting control signal line EM1. The second connection electrode 1232 of the second electrode 123 of the second color sub-pixel 120 is connected to the fourth connection portion 353 through a second anode connection via 1233, and the second anode connection via 1233 is located on a side of the connection via 354 close to the first light emitting control signal line EM1. The third connection electrode 1332 of the second electrode 133 of the third color sub-pixel 130 is connected to the fourth connection portion 353 through a third anode connection via 1333, and the third anode connection via 1333 is located on a side of the via 354 close to the first light emitting control signal line EM1. The first connection electrode 1332 of the second electrode 113 of the first color sub-pixel 110 is connected to the fourth connection portion 353 through a first anode connection via 1133, and the first anode connection via 1133 is located on a side of the connection via 354 away from the first light emitting control signal line EM1, so that there is a certain distance between the connection electrode of the second electrode of the first color sub-pixel and the main electrode of the second electrode of the third color sub-pixel, so as to prevent the two electrode from overlapping or approaching to each other to cause defects.

For example, as shown in FIG. 12, the second color sub-pixels 120 (for example, the red sub-pixels) and the third color sub-pixels 130 (for example, the green sub-pixel) are alternately disposed in the Y direction, and the first-color sub-pixels 110 (for example, the blue sub-pixels) adjacent to the second color sub-pixels 120 and the third color sub-pixels 130 are also disposed in the Y direction, and a sub-pixel row formed by the second color sub-pixels 120 and the third color sub-pixels 130 and a sub-pixel row formed by the first-color sub-pixels 110 are alternately distributed in the X direction. For example, an area of the main electrode of the second electrode of one first color sub-pixel 110 is larger than an area of the main electrode of the second electrode of one second color sub-pixel 120, and is larger than an area of the main electrode of the second electrode of one third color sub-pixel 130. For example, the area of the main electrode of the second electrode of the third color sub-pixel 130 is larger than the area of the main electrode of the second electrode of the second color sub-pixel 120. For example, a size of the main electrode of the second electrode of one first color sub-pixel 110 in the Y direction is greater than a size of the main electrode of the second electrode of one second color sub-pixel 120 in the Y direction, and is larger than a size of the main electrode of the second electrode of the third color sub-pixel 130 in the Y direction. For example, the size of the main electrode of the second electrode of the first color sub-pixel 110 in the Y direction does not exceed a span of the main electrode of the second electrode of the second color sub-pixel 120 and the main electrode of the second electrode of the third color sub-pixel 130 in the Y direction, that is, the main electrode of the second electrode of the first color sub-pixel 110, the main electrode of the second electrode of the second color sub-pixel 120, and the main electrode of the second electrode of the third color sub-pixel 130 are projected on a straight line along the Y direction, the projection of the main electrode of the second electrode of the first color sub-pixel 110 is located between the farthest two points respectively on the projection of the main electrode of the second electrode of the second color sub-pixel 120 and the projection of the main electrode of the second electrode of the third color sub-pixel 130. For example, a size of the main electrode of the second electrode of one first color sub-pixel 110 in the X direction, a size of the main electrode of the second electrode of the second color sub-pixel 120 in the X direction, and a size of the main electrode of the second electrode of the third color sub-pixel 130 in the X direction are roughly the same. For example, the size of the main electrode of the second electrode of the second color sub-pixel 120 in the X direction and the size of the main electrode of the second electrode of the third color sub-pixel 130 in the X direction are roughly the same, and a ratio of the size of the main electrode of the second electrode of the third color sub-pixel 130 and the size of the main electrode of the second electrode of one first color sub-pixel 110 in the X direction is 0.8-1.2. For example, the connection electrode of the second electrode of the second color sub-pixel 120 and the connection electrode of the second electrode of the third color sub-pixel 130 are located on a side of the main electrodes of the second color sub-pixel and the third color sub-pixel facing the main electrode of the second electrode of the first color sub-pixel 110. For example, the connection electrode of the second electrode of the first color sub-pixel 110 is located between the sub-pixel row formed by the second color sub-pixel 120 and the third color sub-pixel 130 and the sub-pixel row formed by the first color sub-pixel 110, and is closer to a side of the second electrode of the third color sub-pixel 130 away from the second electrode of the second color sub-pixel 120.

For example, in the second color sub-pixel 120 and the third color sub-pixel 130 disposed in the Y direction, the second anode connection via 1233 of the second color sub-pixel 120 and the third anode connection via 1333 of the third color sub-pixel 130 are located on a straight line extending along the Y direction, and the first anode connection via 1133 of the first color sub-pixel 110 adjacent to the second color sub-pixel 120 and the third color sub-pixel 130 is located on a side of the straight line away from the first scanning line Ga1. For example, the first anode connection via 1133 of the first color sub-pixel 110 and the connection via 354 of the second color sub-pixel 120 and the connection via 354 of the third color sub-pixel 130 are located on substantially the same straight line extending in the Y direction. The second anode connection via 1233 of the second color sub-pixel 120 overlaps with the second electrode of the first light emitting control transistor T5 of the second color sub-pixel 120, and the third anode connection via 1333 of the third color sub-pixel 130 overlaps with the second electrode of the first light emitting control transistor T5 of the third color sub-pixel 130. The first anode connection via 1133 of the first color sub-pixel 110 is located on a side of the second electrode of the first light emitting control transistor T5 of the first color sub-pixel 110 away from the first light emitting control signal line EM1.

For example, as shown in FIG. 12, the fourth connection portion overlaps with the drain region of the first light emitting control transistor T5 in the pixel circuit of the second color sub-pixel 120. The shape of the fourth connection portion in the pixel circuit of the second color sub-pixel 120 is the same as that of the fourth connection portion of the third color sub-pixel, and relative positional relationship of the fourth connection portion in the pixel circuit of the second color sub-pixel 120 is the same as that of the fourth connection portion of the third color sub-pixel. A length of the fourth connection portion 353 in the pixel circuit of the first color sub-pixel 110 in the X direction is greater than lengths of the fourth connection portions 353 of the sub-pixels with other two colors in the X direction. The fourth connection portion 353 in the pixel circuit of the first color sub-pixel 110 overlaps with the first light emitting control signal line EM1, but the fourth connection portions 353 of the sub-pixels with other two colors do not overlap with the first light emitting control signal line EM1.

For example, as shown in FIG. 12, the display substrate in this example comprises a plurality of pixel units 1 disposed in an array along the first direction and the second direction, and one pixel unit 1 comprises one first color sub-pixel 110 and one second color sub-pixel 120 and one third color sub-pixel 130 that are adjacent to the one first color sub-pixel 110.

It should be noted that in the above example, the shape, size, and position of the second electrode of each sub-pixel are schematically shown in the drawings. For each sub-pixel, the actual light emitting region is defined by the opening of the pixel defining layer. For example, the pixel defining layer is in a grid structure, which covers the edge of the second electrode (e.g., the anode) of each sub-pixel, and the pixel defining layer comprises a plurality of openings, each opening exposes a portion of the second electrode of one sub-pixel, the light emitting layer is formed at least in the plurality of openings, and a first electrode (e.g., the cathode) is formed on a side of the light emitting layer away from the base substrate, and the first electrode and the second electrode corresponding to the opening of each sub-pixel drive the light emitting layer to emit light. For example, a projection of the edge of the opening of the pixel defining layer of each sub-pixel on the base substrate is in a projection of the second electrode of the sub-pixel on the base substrate, so that the arrangement of each sub-pixel, the arrangement of the opening of the pixel defining layer, and the arrangement position of the second electrode are in one-to-one correspondence. For example, the arrangement position of the second electrode of sub-pixel of each color can be in various ways, as shown in FIG. 11A and FIG. 12, and can also be applied to other pixel arrangements. For example, the pixel circuits of respective sub-pixels are disposed in an array of a plurality of rows and a plurality of columns in the X direction and the Y direction. The pixel circuit structure, such as the data line, the power supply line, the capacitor electrode, and the like, of each sub-pixel can be approximately the same except for the size of the driving transistor and the connection electrode structure. For example, along the Y direction, the pixel circuits of respective sub-pixels are disposed in order of the pixel circuit of the first color sub-pixel, the pixel circuit of the second color sub-pixel, and the pixel circuit of the third color sub-pixel, and along the X direction, each row of pixel circuits of the sub-pixels are repeatedly arranged.

The following statements should be noted:

(1) In the accompanying drawings of the embodiments of the present disclosure, the drawings involve only the structure(s) in connection with the embodiment(s) of the present disclosure, and other structure(s) can be referred to common design(s).

(2) In case of no conflict, features in one embodiment or in different embodiments can be combined.

What have been described above are only specific implementations of the present disclosure, the protection scope of the present disclosure is not limited thereto, and the protection scope of the present disclosure should be based on the protection scope of the claims.

What is claimed is:

1. A display substrate comprising:
a base substrate and a plurality of first color sub-pixels, a plurality of second color sub-pixels and a plurality of third color sub-pixels disposed on the base substrate;
a light emitting control signal line, extending along a first direction;
a data line, extending along a second direction, the first direction being intersected with the second direction; and
a power line, overlapping with the data line in a third direction perpendicular to the base substrate, wherein at least one sub-pixel comprises an organic light emitting element and a pixel circuit for driving the organic light emitting element, the organic light emitting element comprises a first electrode, a second electrode and a light emitting layer disposed between the first electrode and the second electrode; the pixel circuit comprises a driving transistor and a first light emitting control transistor, and the pixel circuit further comprises a connection structure disposed in the same layer as the data line, in at least one second color sub-pixel, a first electrode of the first light emitting control transistor of the second color sub-pixel is electrically connected with the connection structure through a first connection hole, and the connection structure is electrically connected with the second electrode of the second color sub-pixel through a second connection hole, an orthographic projection of at least part of the first connection hole on the base substrate is located on a side of an orthographic projection of the light emitting control signal line on the base substrate, and an orthographic projection of at least part of the second connection hole on the base substrate is located on the other side of the orthographic projection of the light emitting control signal line on the base substrate;

in at least one third color sub-pixel, the second electrode of the third color sub-pixel does not overlap with a channel of the driving transistor controlling the organic light emitting element of the third color sub-pixel in the third direction.

2. The display substrate according to claim 1, wherein the second electrode of at least one third color sub-pixel does not overlap with the channels of the driving transistors controlling organic light emitting elements of the sub-pixels of the other colors in the third direction.

3. The display substrate according to claim 1, wherein the display substrate comprises an active semiconductor layer including the channel and a source-drain region of each transistor of each sub-pixel, and the connection structure is electrically connected with the active semiconductor layer through the first connection hole in an inorganic layer between the connection structure and the active semiconductor layer;

the connection structure is electrically connected with the second electrode through the second connection hole in at least one of an organic layer and an inorganic layer between the connection structure and the second electrode, and in the second color sub-pixel, a center of the orthographic projection of the first connection hole on the base substrate and a center of the orthographic projection of the second connection hole on the base substrate are respectively located on both sides of the orthographic projection of the light emitting control signal line on the base substrate.

4. The display substrate according to claim 1, wherein in at least one second color sub-pixel, the orthographic projection of the first connection hole on the base substrate is farther away from an orthographic projection of the second electrode on the base substrate compared with the orthographic projection of the second connection hole on the base substrate.

5. The display substrate according to claim 1, wherein in at least one second color sub-pixel, the second electrode of the second color sub-pixel overlaps with the channel of the driving transistor driving the organic light emitting element of the second color sub-pixel in the third direction.

6. The display substrate according to claim 1, wherein the data line connected to the pixel circuit of at least one second color sub-pixel and the second electrode of the at least one second color sub-pixel are spaced apart from each other in the first direction.

7. The display substrate according to claim 6, wherein the second electrode of the at least one second color sub-pixel and the data line connected to the pixel circuit of the third color sub-pixel overlap in the third direction.

8. The display substrate according to claim 1, wherein an orthographic projection of the second electrode of at least one first color sub-pixel and an orthographic projection of the second electrode of at least one third color sub-pixel on a first straight line extending along the second direction overlap with an orthographic projection of the connection structure of at least one second color sub-pixel on the first straight line.

9. The display substrate according to claim 8, wherein an orthographic projection of the second electrode of at least one third color sub-pixel on a second straight line extending along the first direction overlaps with an orthographic projection of the connection structure of at least one second color sub-pixel on the second straight line.

10. The display substrate according to claim 9, wherein the second electrode of at least one sub-pixel comprises a main electrode and a connection electrode electrically connected with the first light emitting control transistor, an orthographic projection of the main electrode of at least one first color sub-pixel on the first straight line overlaps with the orthographic projection of the connection structure of the at least one second color sub-pixel on the first straight line.

11. The display substrate according to claim 10, wherein an orthographic projection of the main electrode of the at least one third color sub-pixel on the second straight line overlaps with the orthographic projection of the connection structure of the at least one second color sub-pixel on the second straight line.

12. The display substrate according to claim 10, further comprising:

a pixel defining layer located at a side of the second electrode of each sub-pixel away from the base substrate, wherein the pixel defining layer comprises an opening for defining a light emitting region of each sub-pixel, at least part of the organic light emitting layer of each sub-pixel is located in the opening, and an orthographic projection of the opening of the pixel defining layer on the base substrate is located in an orthographic projection of the main electrode of the second electrode of each sub-pixel on the base substrate;

in the pixel defining layer, an area of an opening defining a light emitting region of each third color sub-pixel is greater than an area of an opening defining a light emitting region of each second color sub-pixel and smaller than an area of an opening defining a light emitting region of each first color sub-pixel.

13. The display substrate according to claim 1, further comprising:

a scanning signal line and a reset control signal line, wherein, in at least one sub-pixel, the pixel circuit further comprises a data writing transistor and a reset transistor, a gate electrode of the data writing transistor is configured to be electrically connected with the scanning signal line to receive a scan signal, and a gate electrode of the reset transistor is configured to be electrically connected with the reset control signal line to receive a reset control signal.

14. The display substrate according to claim 13, wherein, in at least one sub-pixel, the pixel circuit further comprises a second light emitting control transistor, and a gate electrode of the first light emitting control transistor and a gate electrode of the second light emitting control transistor are both electrically connected with the light emitting control signal line to receive a light emitting control signal.

15. The display substrate according to claim 13, wherein the second electrode of at least one second color sub-pixel overlaps with the scanning signal line in the third direction.

16. The display substrate according to claim 15, wherein the second electrode of at least one second color sub-pixel overlaps with the scanning signal line electrically connected with the pixel circuit of the second color sub-pixel in the third direction.

17. The display substrate according to claim 1, wherein, in at least one sub-pixel, the pixel circuit further comprises a storage capacitor, a second electrode of the storage capacitor is also used as a gate electrode of the driving transistor, and an area of the second electrode of the storage capacitor of at least one first color sub-pixel is different from that of the second electrode of the storage capacitor of at least one second color sub-pixel.

18. The display substrate according to claim 17, wherein an area of the second electrode of at least one first color sub-pixel is greater than an area of the second electrode of at least one second color sub-pixel, and the area of the second electrode of the storage capacitor of at least one first color sub-pixel is greater than that of the second electrode of the storage capacitor of at least one second color sub-pixel.

19. The display substrate according to claim 17, wherein in at least one second color sub-pixel, a first electrode of the storage capacitor overlaps with the connection structure in the third direction.

20. The display substrate according to claim 1, wherein the second electrode of at least one first color sub-pixel overlaps with the data line in the third direction, and a length of an overlapped portion of the second electrode and the data line in the second direction is greater than 80% of a maximum length of the second electrode in the second direction.

21. The display substrate according to claim 1, wherein the second electrode of at least one first color sub-pixel overlaps with the power line in the third direction, and a length of an overlapped portion of the second electrode and the power line in the second direction is greater than 80% of a maximum length of the second electrode in the second direction.

22. A display device, comprising the display substrate according to claim 1.

* * * * *